(12) United States Patent
Vella et al.

(10) Patent No.: US 12,358,209 B2
(45) Date of Patent: Jul. 15, 2025

(54) PIEZOELECTRIC COMPOSITES FEATURING NONCOVALENT INTERACTIONS AND USE THEREOF IN ADDITIVE MANUFACTURING

(71) Applicants: XEROX CORPORATION, Norwalk, CT (US); NATIONAL RESEARCH COUNCIL OF CANADA, Ottawa (CA)

(72) Inventors: Sarah J. Vella, Milton (CA); Alexandros Vasileiou, Toronto (CA); Yujie Zhu, Mississauga (CA); Edward G. Zwartz, Mississauga (CA); Chantal Paquet, Ottawa (CA)

(73) Assignees: XEROX CORPORATION, Norwalk, CT (US); NATIONAL RESEARCH COUNCIL OF CANADA, Ottawa (CA)

( * ) Notice: Subject to any disclaimer, the term of this patent is extended or adjusted under 35 U.S.C. 154(b) by 169 days.

(21) Appl. No.: 17/995,563

(22) PCT Filed: Mar. 22, 2022

(86) PCT No.: PCT/US2022/021315
§ 371 (c)(1),
(2) Date: Oct. 5, 2022

(87) PCT Pub. No.: WO2022/204121
PCT Pub. Date: Sep. 29, 2022

(65) Prior Publication Data
US 2023/0150188 A1    May 18, 2023

Related U.S. Application Data

(60) Provisional application No. 63/164,679, filed on Mar. 23, 2021.

(51) Int. Cl.
*B29C 64/118* (2017.01)
*B29C 48/05* (2019.01)
(Continued)

(52) U.S. Cl.
CPC .......... *B29C 64/118* (2017.08); *B29C 48/05* (2019.02); *B29C 64/10* (2017.08); *B29C 64/165* (2017.08);
(Continued)

(58) Field of Classification Search
CPC ... C09D 7/63; C09D 7/69; C09D 7/70; C09D 7/61; C09D 167/04; C09D 4/06;
(Continued)

(56) References Cited

U.S. PATENT DOCUMENTS 10,392,521 B2    8/2019  Ng et al.
2016/0181506 A1  6/2016  Sirbuly et al.
(Continued)

FOREIGN PATENT DOCUMENTS

CN    111154253 A    5/2020
CN    111187073 A    5/2020
(Continued)

OTHER PUBLICATIONS

Cholleti, E.R., "A Review on 3D printing of piezoelectricmaterials," IOP Conf. Ser.: Mater. Sci. Eng., 2018, 012046 (18 pp.), 2018.
(Continued)

*Primary Examiner* — Monica A Huson
(74) *Attorney, Agent, or Firm* — Vorys, Sater, Seymour and Pease LLP

(57) ABSTRACT

Parts made by additive manufacturing are often structural in nature, rather than having functional properties conveyed by a polymer or other component. Printed parts having piezoelectric properties may be formed using compositions comprising a plurality of piezoelectric particles non-covalently
(Continued)

interacting with at least a portion of a polymer material via π-π bonding, hydrogen bonding, electrostatic interactions stronger than van der Waals interactions, or any combination thereof. The piezoelectric particles may be dispersed in the polymer material and remain substantially non-agglomerated when combined with the polymer material. The polymer material may comprise at least one thermoplastic polymer, optionally further including a polymer precursor. The compositions may define an extrudable material that is a composite having a form factor such as a composite filament, a composite pellet, a composite powder, or a composite paste. Additive manufacturing processes using the compositions may comprise forming a printed part by depositing the compositions layer-by-layer.

18 Claims, 4 Drawing Sheets

(51) Int. Cl.

| | | |
|---|---|---|
| B29C 64/10 | (2017.01) | |
| B29C 64/165 | (2017.01) | |
| B29C 64/314 | (2017.01) | |
| B29C 64/40 | (2017.01) | |
| B33Y 10/00 | (2015.01) | |
| B33Y 40/10 | (2020.01) | |
| B33Y 70/10 | (2020.01) | |
| B33Y 80/00 | (2015.01) | |
| C08L 23/06 | (2006.01) | |
| C08L 25/06 | (2006.01) | |
| C08L 53/02 | (2006.01) | |
| C08L 67/04 | (2006.01) | |
| C08L 71/02 | (2006.01) | |
| C09D 4/06 | (2006.01) | |
| C09D 5/24 | (2006.01) | |
| C09D 7/40 | (2018.01) | |
| C09D 7/61 | (2018.01) | |
| C09D 7/62 | (2018.01) | |
| C09D 7/63 | (2018.01) | |
| C09D 167/04 | (2006.01) | |
| H10N 30/092 | (2023.01) | |
| H10N 30/85 | (2023.01) | |
| B29K 25/00 | (2006.01) | |
| B29K 33/00 | (2006.01) | |
| B29K 67/00 | (2006.01) | |
| B29K 101/12 | (2006.01) | |
| B29K 105/00 | (2006.01) | |
| B29K 105/04 | (2006.01) | |
| B29K 105/16 | (2006.01) | |
| B29K 507/04 | (2006.01) | |
| B29K 509/00 | (2006.01) | |
| B29K 509/02 | (2006.01) | |
| C08K 3/04 | (2006.01) | |
| C08K 3/22 | (2006.01) | |
| C08K 7/06 | (2006.01) | |
| C08K 9/04 | (2006.01) | |

(52) U.S. Cl.
CPC ............ *B29C 64/314* (2017.08); *B29C 64/40* (2017.08); *B33Y 10/00* (2014.12); *B33Y 40/10* (2020.01); *B33Y 70/10* (2020.01); *B33Y 80/00* (2014.12); *C08L 23/06* (2013.01); *C08L 25/06* (2013.01); *C08L 53/02* (2013.01); *C08L 67/04* (2013.01); *C08L 71/02* (2013.01); *C09D 4/06* (2013.01); *C09D 5/24* (2013.01); *C09D 7/61* (2018.01); *C09D 7/62* (2018.01); *C09D 7/63* (2018.01); *C09D 7/69* (2018.01); *C09D 7/70* (2018.01); *C09D 167/04* (2013.01); *H10N 30/092* (2023.02); *H10N 30/852* (2023.02); *B29K 2025/08* (2013.01); *B29K 2033/08* (2013.01); *B29K 2033/12* (2013.01); *B29K 2067/00* (2013.01); *B29K 2067/04* (2013.01); *B29K 2101/12* (2013.01); *B29K 2105/002* (2013.01); *B29K 2105/0023* (2013.01); *B29K 2105/0088* (2013.01); *B29K 2105/04* (2013.01); *B29K 2105/16* (2013.01); *B29K 2105/162* (2013.01); *B29K 2507/04* (2013.01); *B29K 2509/00* (2013.01); *B29K 2509/02* (2013.01); *B29K 2995/0003* (2013.01); *B29K 2995/0005* (2013.01); *B29K 2995/0077* (2013.01); *C08K 3/04* (2013.01); *C08K 2003/2234* (2013.01); *C08K 2003/2237* (2013.01); *C08K 2003/2244* (2013.01); *C08K 7/06* (2013.01); *C08K 9/04* (2013.01); *C08K 2201/001* (2013.01); *C08K 2201/005* (2013.01); *C08K 2201/011* (2013.01); *C08L 2207/04* (2013.01); *C08L 2207/062* (2013.01)

(58) Field of Classification Search
CPC .. C09D 5/24; C09D 7/62; C08L 53/02; C08L 67/04; C08L 1/12; C08L 23/06; C08L 25/06; C08L 71/02; C08L 2207/062; C08L 2207/04; H10N 30/084; H10N 30/852; H10N 30/092; H10N 30/081; B33Y 70/10; B33Y 40/10; B33Y 80/00; B33Y 10/00; B29C 64/10; B29C 64/40; B29C 64/118; B29C 64/314; B29C 48/05; B29C 64/165; C08G 83/001; C08K 3/04; C08K 7/06; C08K 9/04; C08K 2003/2244; C08K 2003/2237; C08K 2201/001; C08K 2201/005; C08K 2201/011; C08K 2003/2234; B29K 2033/08; B29K 2105/0088; B29K 2105/04; B29K 2995/0077; B29K 2105/002; B29K 2101/12; B29K 2507/04; B29K 2067/04; B29K 2105/16; B29K 2067/00; B29K 2509/02; B29K 2995/0003; B29K 2105/0023; B29K 2509/00; B29K 2995/0005; B29K 2105/162; B29K 2025/08; Y02P 10/25
See application file for complete search history.

(56) References Cited

U.S. PATENT DOCUMENTS

| | | |
|---|---|---|
| 2016/0322560 A1 | 11/2016 | Sirbuly et al. |
| 2017/0148539 A1 | 5/2017 | Prestayko et al. |
| 2018/0141274 A1 | 5/2018 | Fink et al. |
| 2019/0054659 A1 | 2/2019 | Tseng et al. |
| 2019/0181331 A1 | 6/2019 | Lee et al. |
| 2019/0284423 A1 | 9/2019 | Bodkhe et al. |
| 2019/0365541 A1 | 12/2019 | Friis et al. |
| 2020/0283651 A1 | 9/2020 | Wright et al. |
| 2020/0357979 A1 | 11/2020 | Kim et al. |
| 2021/0234089 A1 | 7/2021 | Zheng et al. |
| 2022/0069195 A1 | 3/2022 | Markanday et al. |

FOREIGN PATENT DOCUMENTS

| | | |
|---|---|---|
| KR | 20210012731 A | 2/2021 |
| WO | 2019227082 A1 | 11/2019 |

OTHER PUBLICATIONS

Kim, H., et al., "Fabrication and Characterization of 3D printed BaTiO3/PVDF nanocomposites," J. Comp. Mater., 2018, pp. 197-206, 52.

(56) References Cited

OTHER PUBLICATIONS

Wu, Y., et al., "Fabrication of Composite Filaments with High Dielectric Permittivity for Fused Deposition 3D Printing," Materials, 2017, 1218 (11 pp.), 10.

Killic, A., et al., "Improving electret properties of PP filaments with barium titanate," J. Electrostatics, 2013, pp. 41-47, 2013.

Chiolerio, A., et al., "Effect of the fabrication method on the functional properties of BaTiO3:PVDF nanocomposites" J. Mater. Sci., 2013, pp. 6943-6951, 48.

Kim, K., et al., "3D Optical Printing of Piezoelectric Nanoparticle-Polymer Composite Materials," ACS Nano, 2014, pp. 9799-9806, 8.

Kim, K., et al., "Tunable Surface and Matrix Chemistries in Optically Printed (0-3) Pizeoelectric Nanocomposites," ACS App. Mater. Interfaces, 2016, pp. 33394-33398, 8.

Konuray, O. et al., "Dual-curable stereolithography resins for superior thermomechanical properties", Express polymer letters, 2020, pp. 881-894, 14.

Salaeh, S., "Processing of natural rubber composites and blends : relation between structure and properties," Materials Science [cond-mat.mtrl-sci]. Université Claude Bernard—Lyon I; Prince of Songkla University, 2014.

Fenouillot, F., et al., "Uneven distribution of nanoparticles in immiscible fluids: Morphology development in polymer blends," Polymer, 2009, pp. 1333-1350, 50.

Martinez-Ayuso, G., et al., "Homogenization of porous piezoelectric materials," International Journal of Solids and Structures, 2017, pp. 218-229, 113-114.

Bai, L., et al., "Kinetic Control of Graphene Localization in Co-continuous Polymer Blends via Melt Compounding," Langmuir, 2018, pp. 1073-1083, 34.

Guan, X., et al., "PZT/PVDF composites doped with carbon nanotubes," Sensors and Actuators A: Physical, 2013, pp. 228-231, 194.

Li, W., et al., "Enhancing conjugation degree and interfacial interactions to enhance dielectric properties of noncovalent functionalized graphene/poly (vinylidene fluoride) composites," Carbon, 2019, pp. 728-738, 141.

Li, W., et al., "The Control of Silica Nanoparticles on the Phase Separation of Poly(methyl methacrylate)/Poly(styrene-co-acrylonitrile) Blends," Macromol. Chem. Phys., 2013, pp. 2705-2715, 214.

McCall W.R., et al., "Piezoelectric nanoparticle-polymer composite foams," ACS Appl. Mater. Interfaces, 2014, pp. 19504-19509, 6.

Utracki, L., "Compatibilization of Polymer Blends," Canadian Journal of Chemical Engineering, 2002, pp. 1008-1016, 80.

Vasileiou, A., et al., "A Noncovalent Compatibilization Approach to Improve the Filler Dispersion and Properties of Polyethylene/Graphene Composites," ACS Appl. Mater. Interfaces, 2014, pp. 1916-1925, 6.

Yao, D., et al., "3D Printed Nanocomposites: Achieving the Upper Bound of Piezoelectric Response in Tunable, Wearable 3D Printed Nanocomposites," Adv. Funct. Mater., 2019, p. 1970289, 29.

Zhao, P., et al., "Properties of cement-sand-based piezoelectric composites with carbon nanotubes modification," Ceramics International, 2916, pp. 15030-15034, 42.

Written Opinion and International Search Report from corresponding PCT Application No. PCT/US2022/021315 mailed Jul. 1, 2022.

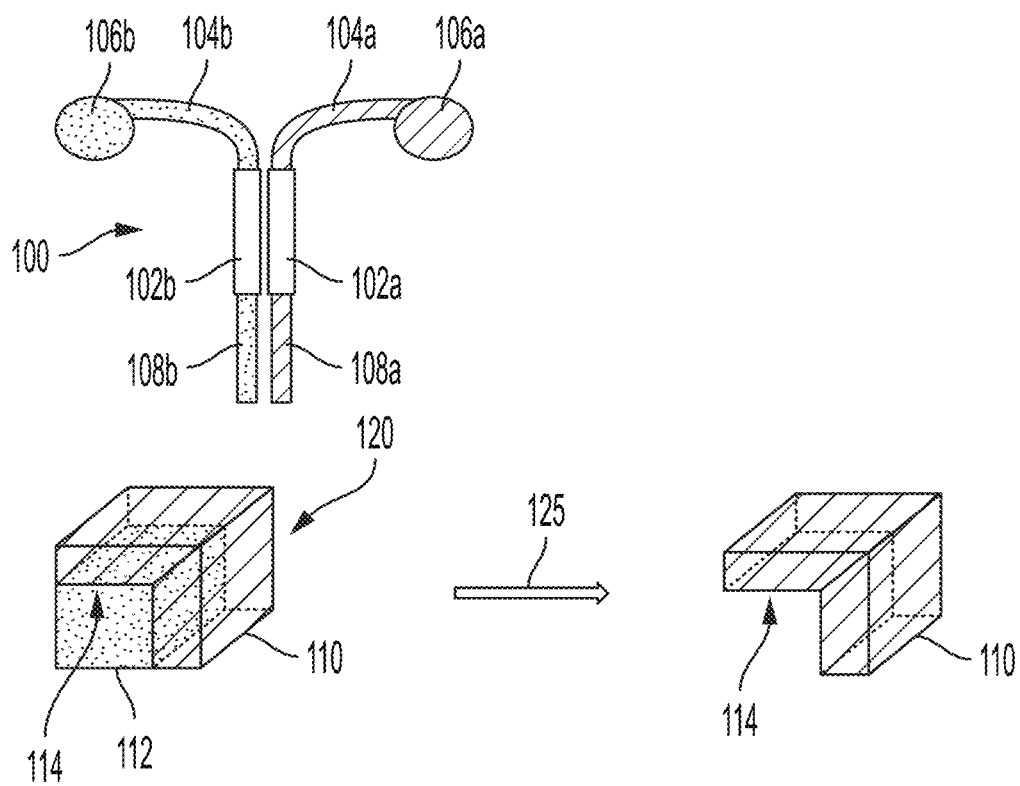
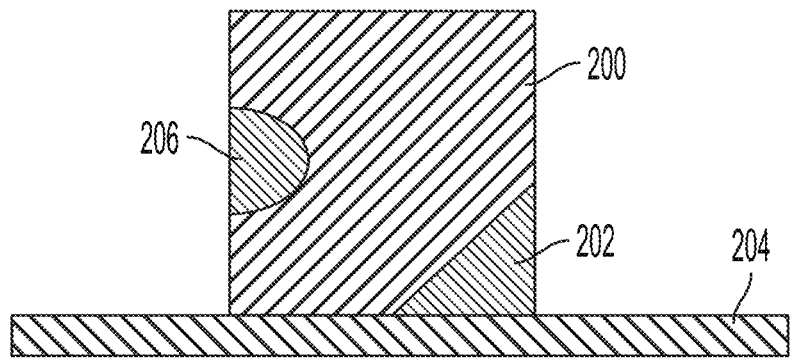
FIG. 2

PIEZOELECTRIC COMPOSITES FEATURING NONCOVALENT INTERACTIONS AND USE THEREOF IN ADDITIVE MANUFACTURING

FIELD

The present disclosure generally relates to additive manufacturing and, more particularly, extrudable compositions suitable for additive manufacturing to form printed parts exhibiting piezoelectric properties.

BACKGROUND

Additive manufacturing, also known as three-dimensional (3-D) printing, is a rapidly growing technology area. Although additive manufacturing has traditionally been used for rapid prototyping activities, this technique is being increasingly employed for producing commercial and industrial parts in any number of complex shapes. Additive manufacturing processes typically operate by building an object (part) layer-by-layer, for example, by 1) depositing a stream of molten printing material obtained from a continuous filament or other printing material source, 2) sintering powder particulates of a printing material using a laser, or 3) direct writing using an extrudable paste composition. The layer-by-layer deposition usually takes place under control of a computer to deposit the printing material in precise locations based upon a digital three-dimensional "blueprint" of the part to be manufactured, with consolidation of the printing material often taking place in conjunction with deposition to form the printed part. The printing material forming the body of a printed part may be referred to as a "build material" herein.

Additive manufacturing processes employing a stream of molten printing material for part formation may utilize a thermoplastic polymer filament as a source of the molten printing material. Such additive manufacturing processes are sometimes referred to as "fused deposition modeling" or "fused filament fabrication" processes. The latter term is used herein.

Additive manufacturing processes employing thermoplastic polymer pellets or other polymer forms as a source of printing material are also known. Extrudable paste compositions comprising thermoplastic polymers or curable polymer precursors (resins) may also be utilized in similar direct writing additive manufacturing processes.

Additive manufacturing processes employing powder particulates of a printing material oftentimes perform directed heating in selected locations of a particulate bed (powder bed) following printing material deposition to promote coalescence of the powder particulates into a consolidated part. Techniques suitable for promoting consolidation of powder particulates to form a consolidated part include, for example, Powder Bed Fusion (PBF), selective laser sintering (SLS), Electron Beam Melting (EBM), Binder Jetting and Multi-Jet Fusion (MJF).

A wide range of parts having various shapes may be fabricated using the foregoing additive manufacturing processes. In many instances, build materials employed in such additive manufacturing processes may be largely structural in nature, rather than the polymer having an innate functionality itself. One exception is piezoelectric functionality, which may be exhibited in printed objects formed from polyvinylidene fluoride, a polymer which possesses innate piezoelectric properties upon poling. Piezoelectric materials generate charge under mechanical strain or, conversely, undergo mechanical strain when a potential is applied thereto. Potential applications for piezoelectric materials include, for example, sensing, switching, actuation, and energy harvesting.

Despite the desirability of forming printed parts having piezoelectric properties, there are only limited options for doing so at present. Other than polyvinylidene fluoride, the range of piezoelectric polymers is rather limited, and some alternative polymers are not suitable for being printed in additive manufacturing processes employing extrusion. For example, crosslinked polymers are completely unworkable once they have been crosslinked, and polymer resins suitable for forming crosslinked polymers may not by themselves afford composite forms (form factors) suitable for printing in fused filament fabrication and similar printing processes and/or printed parts formed from polymer resins may not be self-supporting before crosslinking takes place. Moreover, the piezoelectricity of polyvinylidene fluoride is rather low compared to other types of piezoelectric materials. These shortcomings may limit the range of printed parts having a piezoelectric response that may be obtained through present additive manufacturing processes.

Numerous ceramic materials having high piezoelectricity are available, such as lead-zirconium-titanate (PZT), but they are not printable by themselves and are often very brittle. Moreover, high sintering temperatures (>300° C.) may be needed to promote part consolidation and piezoelectric particle interconnectivity after depositing predominantly a piezoelectric ceramic. Admixtures of polymers and piezoelectric particles have not yet afforded high piezoelectric performance in printed parts. Poor dispersion of the piezoelectric particles in the polymer, particle agglomeration, and limited interactions between the piezoelectric particles and the polymer are to blame in many instances. Without being bound by any theory, the limited interactions between the piezoelectric particles and the polymer results in poor load transfer to the piezoelectric particles, thereby lowering the piezoelectric response obtained therefrom when mechanical strain is applied. Particle agglomeration may also play a role in this regard.

SUMMARY

In various embodiments, the present disclosure provides compositions comprising: a plurality of piezoelectric particles dispersed in at least a portion of a polymer material; wherein the piezoelectric particles interact non-covalently with the polymer material via $\pi$-$\pi$ bonding, hydrogen bonding, electrostatic interactions stronger than van der Waals interactions, or any combination thereof. Printed parts may comprise the compositions.

In other various embodiments, the present disclosure provides additive manufacturing methods comprising: providing a composition comprising a plurality of piezoelectric particles dispersed in at least a portion of a polymer material; wherein the piezoelectric particles interact non-covalently with the polymer material via $\pi$-$\pi$ bonding, hydrogen bonding, electrostatic interactions stronger than van der Waals interactions, or any combination thereof; and forming a printed part by depositing the composition layer-by-layer.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and having the benefit of this disclosure.

FIG. 1 shows a schematic of an illustrative fused filament fabrication process for producing a part using a build material and a removable support material.

FIG. 2 shows a schematic of an illustrative part having a first removable support interposed between the part and a print bed and a second removable support interposed between two portions of the part.

DETAILED DESCRIPTION

Figure 3:
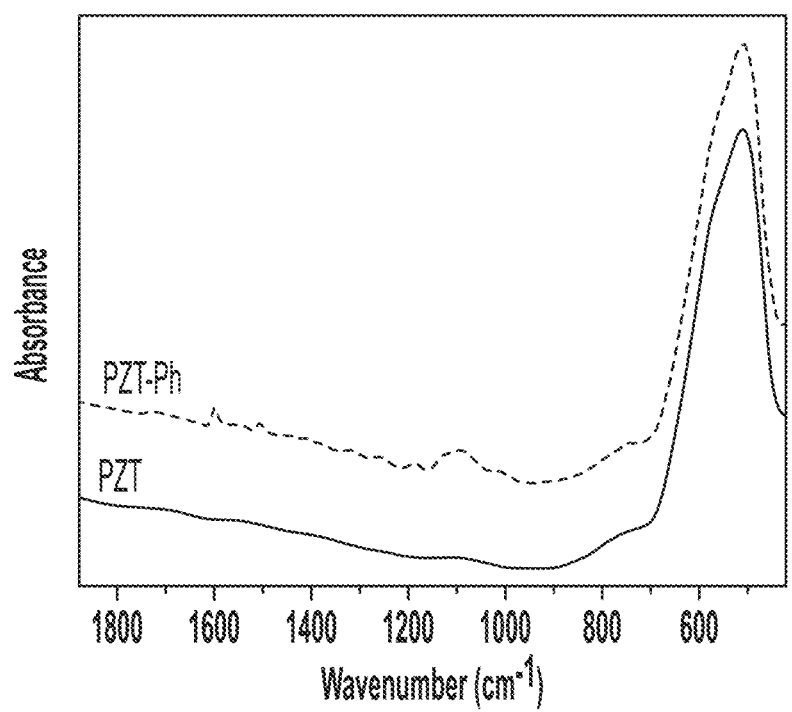
FIG. 3 is an illustrative overlay of FTIR spectra of PZT particles and PZT-Ph particles.

The present disclosure generally relates to additive manufacturing, and more particularly, extrudable compositions suitable for additive manufacturing to form printed parts exhibiting piezoelectric properties. More specifically, the present disclosure provides compositions suitable for additive manufacturing in which piezoelectric particles are combined with a polymer material in a composite having a form factor suitable for additive manufacturing, and in which the piezoelectric particles may experience non-covalent interactions with the polymer material. The non-covalent interactions may increase compatibility between the piezoelectric particles and the polymer material and enhance the piezoelectric response (piezoelectricity) obtained from the composites and printed parts formed therefrom. The non-covalent interactions may include π-π-bonding, hydrogen bonding, electrostatic interactions stronger than van der Waals interactions, or any combination thereof. The composites are extrudable and may have various form factors such as, but not limited to, composite filaments, composite pellets, composite powders, and composite pastes.

As discussed above, additive manufacturing processes, such as fused filament fabrication, direct writing, or similar layer-by-layer deposition processes, are powerful tools for generating printed parts in a wide range of complex shapes. In many instances, the polymer materials used in layer-by-layer additive manufacturing processes are largely structural in nature and do not convey functional properties to a printed part by themselves. Polyvinylidene fluoride is a notable exception, which may form printed parts having piezoelectricity after suitable poling. Beyond polyvinylidene fluoride, there are few alternative polymer materials for introducing piezoelectricity to a printed part. Furthermore, the piezoelectricity of polyvinylidene fluoride may not be sufficiently large for some intended applications.

In response to the foregoing shortcomings, the present disclosure provides compositions that are composites capable of undergoing extrusion to form printed parts through layer-by-layer additive manufacturing. The composites may have more robust mechanical properties than do the piezoelectric particles alone, at the least being less brittle and more flexible, and may be formed more readily into printed parts than can the piezoelectric particles alone. More specifically, the compositions comprise a plurality of piezoelectric particles that interact non-covalently with at least a portion of a polymer material. Suitable non-covalent interactions may include, for example, π-π bonding, hydrogen bonding, electrostatic interactions stronger than van der Waals interactions, or any combination thereof. Surprisingly, the non-covalent interactions may increase compatibility between the piezoelectric particles and the polymer material and enhance the piezoelectricity obtained from the composites once formed into a printed part. Without being bound by any theory or mechanism, the non-covalent interactions are believed to enhance the piezoelectric effect by promoting load transfer from the polymer material to the piezoelectric particles. Evidence of the improved compatibility between the polymer material and the piezoelectric particles may include improved dispersion of the piezoelectric particles within the polymer material, as demonstrated by imaging, and/or enhancement of the piezoelectric response in comparison to that obtained without the non-covalent interactions being present.

Suitable form factors of the composites that may be processed by extrusion in the disclosure herein include composite filaments, composite pellets, composite powders, composite pastes, or any combination thereof. Additional details regarding these various form factors follows herein. Polymer materials that may be present within the composites include thermoplastic polymers, thereby allowing printed parts containing piezoelectric particles to be formed directly through extrusion and solidification of the polymer material. In addition or alternately, the piezoelectric particles may be combined with at least one polymer precursor, either to a thermoplastic polymer or a covalently crosslinked polymer, which may allow polymer formation to take place concurrently when forming printed parts containing piezoelectric particles. In one example, at least one polymer precursor may be combined with at least one thermoplastic polymer that interacts non-covalently with the piezoelectric particles. Polymer precursors may be utilized, for example, when piezoelectric particles may not be adequately mixed with a pre-formed polymer (including when the polymer is a covalently crosslinked polymer), or the composite may not be easily extruded when polymerization or covalent crosslinking has already taken place. In the case of a printed part comprising at least one covalently crosslinked polymer, preferably in addition to at least one thermoplastic polymer, the stiff crosslinked polymer may again promote load transfer to the piezoelectric particles to increase the piezoelectric response obtained therefrom.

Advantageously, a range of polymer materials having functionality capable of interacting with piezoelectric particles through π-π bonding, hydrogen bonding, and/or electrostatic interactions are commercially available or may be readily accessed by incorporation of a co-monomer capable of promoting such non-covalent interactions. Similarly, piezoelectric particles may contain surface functional groups, such as surface hydroxyl groups, which may be readily functionalized with a moiety capable of promoting a non-covalent interaction as specified herein.

Composite filaments and composite pellets containing a polymer material and piezoelectric particles may be obtained by melt blending in the case where the polymer material comprises at least one thermoplastic polymer. Through selection of the polymer material and the amount of piezoelectric particles, these form factors may be formed into printed parts via extrusion and layer-by-layer deposition, such as through fused filament fabrication processes in the case of composite filaments, to afford significant piezoelectricity, after poling of the printed part. Composite filaments that are suitable for fused filament fabrication may have diameters that are appropriate for the drive unit for a particular printing system (common filament diameters include 1.75 mm and 2.85 mm). Other properties that may determine if a composite filament is suitable for fused filament fabrication include the temperature required to extrude the filament, which should not be undesirably high. A suitable composite filament for fused filament fabrication may further minimize printing issues, such as oozing from the print nozzle or clogging of the print nozzle, which may be impacted by the overall viscosity of the composite at the printing temperature. In addition, composite filaments suitable for fused filament fabrication may afford form parts that easily separate from a print bed, have sufficient mechanical strength once printed, and exhibit good interlayer adhesion. Additional characteristics of suitable composite filaments and other form factors are specified below.

Composite filaments and other form factors obtained by melt blending may mix the piezoelectric particles with the polymer material, such as a substantially uniform distribution of the piezoelectric particles in at least a portion of the polymer material. Suitable melt blending processes may include melt mixing with stirring, followed by extrusion of the resulting melt blend, or direct blending via extrusion with a twin-screw extruder. Surprisingly, such melt blending processes followed by further extrusion may afford a good distribution of the piezoelectric particles within the resulting composite and printed parts obtained therefrom. Cryo-milling, grinding or shredding before further extrusion of the composite may further facilitate the extrusion process and promote distribution of the piezoelectric particles within at least a portion of the polymer material. Preferably, the melt blending processes may be conducted without the combination of the at least one thermoplastic polymer and the piezoelectric particles ever being exposed to a solvent together, which may otherwise result in trace organic solvents remaining in the composites following extrusion in some instances, and undesirably become incorporated within a printed part. Moreover, melt blending with little to no void formation in the composites may be realized even in the absence of surfactants and other surface compatibilizers, which otherwise may be detrimental to include in a printed part. Further surprisingly and advantageously, little or no agglomeration of the piezoelectric particles within the polymer material may occur following melt blending, which may desirably improve the piezoelectric properties obtained after poling. A uniform distribution of individual piezoelectric particles in the polymer material may be realized in some instances, wherein the piezoelectric particles remain above a percolation threshold concentration within the polymer material. The piezoelectric particles may be considered above a percolation threshold concentration if the piezoelectric particles communicate with one another to generate a voltage when a mechanical load is being applied to the composites.

Advantageously, high loadings of the piezoelectric particles may be tolerated in the composites described herein, while still maintaining extrudability and affording printed parts having high structural integrity and with the piezoelectric particles remaining in a substantially non-agglomerated and well-dispersed state following printing. Distribution of the piezoelectric particles as individuals rather than as agglomerates may afford a significant increase in the piezoelectric response obtained after poling, since there may be a greater particle surface area to undergo interaction with the polymer material to promote load transfer in between. This effect may be further supplemented with non-covalent interactions according to the disclosure herein.

Composite filaments compatible with fused filament fabrication may be formed in the disclosure herein. Although composite filaments may be an advantageous and particularly versatile form factor, it is to be realized that composite pellets may also be produced through melt blending processes and used in similar additive manufacturing processes. Namely, a thermoplastic polymer and piezoelectric particles may be combined with one another under melt blending conditions, and instead of extruding to form composite filaments, larger extrudates may be produced, which may then be cut, shredded, pulverized, or the like to afford composite pellets of a specified size and geometry or composite powders having even smaller dimensions and a wide distribution of particle sizes. Other than having a different shape, the microscopic morphology of the composite pellets and composite powders may be similar to that of composite filaments. Like composite filaments, composite pellets and composite powders may be subsequently processed into printed parts having piezoelectric properties under suitable additive manufacturing conditions.

In the disclosure herein, "filaments" are to be distinguished from "fibers" on the basis that filaments comprise a single elongate form factor, whereas fibers comprise multiple filaments twisted together (bundled) to form a fine thread or wire in which the individual filaments remain identifiable. As such, filaments have smaller diameters than do fiber bundles formed therefrom, assuming no filament compression takes place when forming a fiber bundle. Filaments obtained by solution electrospinning or melt electrospinning are usually up to about 100 µm in diameter, which is too small to be effectively printed using fused filament fabrication. The composite filaments obtained by melt blending and extrusion in the disclosure herein, in contrast, may be about 0.5 mm or more in size and dimensioned for compatibility with a particular printing system for fused filament fabrication.

Another suitable form factor that may be produced in the disclosure herein is an extrudable composite paste. As used herein, the term "paste" refers to a composition that is at least partially fluid at a temperature of interest. The term "paste" does not necessarily imply an adhesive function of any type. Moreover, the terms "paste" and "ink" may be used interchangeably with one another in the disclosure herein with respect to direct writing additive manufacturing processes. Unlike composite filaments and composite pellets discussed in brief above, extrudable composite pastes may comprise at least one solvent to facilitate extrusion. The at least one solvent may or may not dissolve the polymer material present therein. Optionally, suitable composite pastes may be at least biphasic and contain at least two immiscible fluid phases, wherein the piezoelectric particles and the polymer material are present in one or both of the at least two immiscible fluid phases. Localization of the piezoelectric particles in one phase or at an interface between polymer phases may increase the piezoelectric response attainable therefrom. The polymer material and the piezoelectric particles may be processed into a composite, such as through melt blending and decreasing particle size as discussed above, wherein particles of the pre-made composite are present in at least one phase of the extrudable composite paste. Alternately, a polymer material may be at least partially dissolved in at least one phase of an extrudable composite paste, and dispersion of the piezoelectric particles within the polymer material may take place as the extrudable composite paste is extruded into a desired shape when forming a printed part. Additional details regarding extrudable composite pastes are also provided hereinbelow.

Any of the foregoing form factors may have their piezoelectric properties enhanced by introducing one or more non-covalent interactions between the polymer material and the piezoelectric particles according to the disclosure herein. The resulting improvement in load transfer between the polymer material and the piezoelectric particles may improve the piezoelectric response, as well as increase mechanical strength of the composites and printed parts obtained therefrom. Advantageously, various types of piezoelectric particles may be functionalized with a group that may promote formation of a non-covalent interaction with a complementary group within a polymer material. Likewise, one or more groups capable of undergoing a non-covalent interaction may be incorporated in a polymer material as well.

Before addressing various aspects of the present disclosure in further detail, a brief discussion of additive manufacturing processes, particularly fused filament fabrication processes, parts will first be provided so that the features of the present disclosure can be better understood. FIG. 1 shows a schematic of an illustrative fused filament fabrication process for producing a part using a build material and a removable support material. As shown in FIG. 1, print head 100 includes first extruder 102a and second extruder 102b, which are each configured to receive a filamentous printing material. Specifically, first extruder 102a is configured to receive first filament 104a from first payout reel 106a and provide molten stream 108a of a first printing material, and second extruder 102b is configured to receive second filament 104b from second payout reel 106b and provide molten stream 108b of a second printing material.

Both molten streams are initially deposited upon a print bed (not shown in FIG. 1) to promote layer-by-layer growth of supported part 120. The first printing material (build material) supplied by first extruder 102a may be a piezoelectric composite used to fabricate part 110, and the second printing material (removable support material) supplied by second extruder 102b may be a dissolvable or degradable polymer, which is used to fabricate removable support 112 under overhang 114. Overhang 114 is not in direct contact with the print bed or a lower printed layer formed from the build material. Overhang 114 need not necessarily be present in a given printed part. In the part arrangement shown in FIG. 1, removable support 112 is interposed between overhang 114 and the print bed, but it is to be appreciated that in alternatively configured parts, removable support 114 may be interposed between two or more portions of part 110. FIG. 2, for example, shows illustrative part 200, in which removable support 202 is interposed between an overhang defined between part 200 and print bed 204, and removable support 206 is interposed between two portions of part 200.

Referring again to FIG. 1, once printing of part 110 and removable support 112 is complete, supported part 120 may be subjected to support removal conditions 125 that result in elimination of removable support 112 (e.g., dissolution or disintegration conditions, or the like) and leave part 110 with overhang 114 unsupported thereon. Support removal conditions 125 may include contact of supported part 120 with a solvent in which removable support 112 is dissolvable or degradable and part 110 is not.

If a printed part is being formed without an overhang or similar feature, it is not necessary to utilize a removable support material during fabrication of the printed part. Similarly, two or more different build materials may be utilized as well, such as when one or more of the build materials is structural in nature and one or more of the build materials is functional in nature. In non-limiting examples, a structural polymer may be concurrently printed with a piezoelectric composite of the present disclosure. Further disclosure directed to such piezoelectric composites is provided herein.

Compositions of the present disclosure may comprise a plurality of piezoelectric particles non-covalently interacting with a polymer material by one or more non-covalent interactions. More specifically, compositions of the present disclosure may comprise a plurality of piezoelectric particles dispersed in at least a portion of polymer material and interacting non-covalently with the polymer material by $\pi$-$\pi$ bonding, hydrogen bonding, electrostatic interactions stronger than van der Waals interactions, or any combination thereof. In various embodiments, the piezoelectric particles and the polymer material may interact by at least $\pi$-$\pi$ bonding and/or charge-charge interactions. The piezoelectric particles may be dispersed within the polymer material in a uniform or non-uniform manner, such as a gradient distribution. In addition, at least a portion of the polymer material may not contain piezoelectric particles at all, such that the piezoelectric particles are concentrated in a particular polymer phase.

The compositions disclosed herein are extrudable and maintain the ability to form self-standing three-dimensional structures once extruded during an additive manufacturing process. The term "self-standing" means that a printed part holds its shape and/or exhibits a yield stress once the composition has been extruded into a desired shape. In contrast, compositions that do not hold their shape following extrusion are referred to as "conformal," since they may assume the profile of the surface upon which they are deposited. In many instances, the ability for a composite to be extruded and the ability for the composite to provide a self-standing structure following extrusion are mutually exclusive features. For example, a composite that is extrudable may lack sufficient mechanical strength to support itself upon being deposited in a desired shape, and a composite that hold its shape within a three-dimensional structure may be too rigid to be extruded. The composites described herein may further be processed into various form factors capable of undergoing continuous extrusion.

The term "extrusion" and various grammatical forms thereof refers to the ability of a fluid to be dispensed through a small nozzle. In addition to producing self-standing structures, the composites disclosed herein may be formulated to maintain extrudability once they are heated at or above a melting point or softening temperature of a thermoplastic polymer therein. Both the thermoplastic polymer and the piezoelectric particles, as well as amounts thereof, may be selected to convey extrudability to the composites described herein. Composite pastes containing a thermoplastic polymer need not necessarily be heated at or above the melting point or softening temperature to facilitate extrusion, since such compositions are already at least partially in a fluid form. Once the composites of the present disclosure have been extruded into a desired shape, the shape may be maintained as consolidation of the thermoplastic polymer(s) occurs.

Non-covalent interactions resulting from $\pi$-$\pi$ bonding may arise when two aromatic groups interact with each other. That is, to produce a $\pi$-$\pi$ noncovalent interaction between the piezoelectric particles and the polymer material, both the piezoelectric particles and the polymer material contain an aromatic group. Non-covalent interactions by $\pi$-$\pi$ bonding can occur when the delocalized $\pi$-electron clouds of aromatic ring systems interact interfacially with one another, preferably extended aromatic ring systems containing two or more fused aromatic rings. The aromatic group upon the piezoelectric particles may be directly attached to the surface of the particle or be appended by a linker moiety covalently attached to the surface of the particle. Linker moieties suitable for attaching an aromatic group to piezoelectric particles may include, for example, silane-terminated or thiol-terminated linker moieties. Illustrative silane functionalities that can form a covalent bond with surface hydroxyl groups of piezoelectric particles may include, for example, alkoxysilanes, dialkoxysilanes, trialkoxysilanes, alkyldialkoxysilanes, dialkylalkoxysilanes, aryloxysilanes, diaryloxysilanes, triaryloxysilanes, silanols, disilanols, trisilanols, and any combination thereof. Similarly, if not already present in a given type of polymer material, a co-monomer containing an aromatic group may be copolymerized with one or more non-aromatic monomers to produce a polymer suitable for use in the disclosure herein. Grafting of an aromatic group onto the backbone of a polymer material may also be conducted in some instances. Other types of groups that may bond covalently to the surface of piezoelectric particles for introducing various functionalities thereon include, for example, phosphines, phosphine oxides, phosphonic acids, phosphonyl esters, carboxylic acids, alcohols, and amines. Aromatic groups suitable for promoting non-covalent interactions between piezoelectric particles and a polymer material may include, for example, phenyl, naphthalenyl, anthracenyl, phenanthrenyl, pyrenyl, benz(a)anthracenyl, tetracenyl, benzo[a]pyrenyl, benzo[e]pyrenyl, benzo(g,h,i)perylenyl, chrysenyl, and dibenz(a,h)anthracenyl.

Non-covalent interactions resulting from hydrogen bonding may arise when a hydrogen bond donor and a hydrogen bond acceptor interact with each other. The hydrogen bond donor is located upon one of the piezoelectric particles and the polymer material and the hydrogen bond acceptor is located upon the other of the piezoelectric particles and the polymer material. Hydrogen bond donors may include, for example, hydroxyl groups, amine groups, carboxylic acid groups, and the like. Hydrogen bond acceptors may include any oxygen atom or oxygen-containing functional group, any nitrogen atom or nitrogen-containing functional group, or a fluorine atom. If not already present upon the piezoelectric particles or the polymer material, such hydrogen bond donors or hydrogen bond acceptors may be introduced by one having ordinary skill in the art. Optionally, hydrogen bond donors or hydrogen bond acceptors may be introduced onto piezoelectric particles through a linker moiety using similar attachment chemistries to those discussed above.

Non-covalent interactions resulting from electrostatic interactions may arise when a piezoelectric particle and a polymer material having opposite charges interact with each other (charge pairing or charge-charge interactions), including induced charge interactions in a dipole. Positively charged groups that may be present within either the piezoelectric particles or the polymer material may include, for example, protonated amines and quaternary ammonium groups. Negatively charged groups that may be present within either the piezoelectric particles or the polymer material may include, for example, carboxylates, sulfates, sulfonates, and the like. Like other types of non-covalent interactions, suitable groups capable of charge pairing may be introduced upon piezoelectric particles or a polymer material by one having ordinary skill in the art, including through attachment of a linker moiety to the piezoelectric particles. Other types of suitable electrostatic interactions may include, for example, charge-dipole, dipole-dipole, induced dipole-dipole, charge-induced dipole, and the like.

The compositions described herein are composites that are extrudable and may be in various form factors. In particular, the polymer material and the piezoelectric particles may collectively define an extrudable material that is a composite having a form factor selected from the group consisting of composite filaments, composite pellets, composite powders, and composite pastes. The piezoelectric particles may be mixed with the polymer material in any of these form factors, such as a substantially uniform dispersion of the piezoelectric particles in at least a portion of the polymer material. Additional description of these form factors follows.

The polymer material or the piezoelectric particles may constitute a majority component of the composites disclosed herein. More preferably, the piezoelectric particles may comprise at least about 10 vol. %, or at least about 20 vol. %, or at least about 30 vol. %, or at least about 40 vol. %, or at least about 50 vol. %, or at least about 60 vol. %, or at least about 70 vol. %, or at least about 80 vol. %, or at least about 85 vol. %, or at least about 90 vol. %, or at least about 95 vol. % of the composites based on total volume. In more particular examples, the piezoelectric particles may comprise about 10 vol. % to about 85 vol. %, or about 25 vol. % to about 75 vol. %, or about 40 vol. % to about 60 vol. %, or about 50 vol. % to about 70 vol. % of the composite. A minimum volume percentage may be selected such that satisfactory piezoelectric properties are realized. A maximum volume percentage of the piezoelectric particles may be chosen such that the composite maintains structural integrity and extrudability. For example, in the case of composite filaments, the amount of piezoelectric particles may be chosen to maintain structural integrity as a continuous filament and that also remains printable by fused filament fabrication. Preferably, the piezoelectric particles may be distributed within the polymer material in a composite under conditions at which the piezoelectric particles remain substantially dispersed as individuals without becoming significantly agglomerated with each other.

Composite filaments of the present disclosure may be suitable for use in fused filament fabrication and comprise at least one thermoplastic polymer and a plurality of piezoelectric particles dispersed in the at least one thermoplastic polymer. Optionally, at least one polymer precursor, such as a polymerizable monomer or oligomer or a curable resin, may be combined with the at least one thermoplastic polymer in the polymer material. The term "curable resin" refers to a divalent polymerizable substance that undergoes covalent crosslinking upon being cured. Alternately or additionally, suitable composite filaments may comprise at least one polymer precursor that may be converted into a thermoplastic polymer or a covalently crosslinked polymer when printing the composite filaments. In non-limiting examples, the composite filaments may be formed by melt blending, preferably such that the piezoelectric particles remain in a substantially non-agglomerated form following formation of the composite filaments. In various embodiments, the piezoelectric particles may be no more agglomerated than an extent of particle agglomeration prior to melt blending.

Composite pellets having distributed piezoelectric particles may similarly be obtained by melt blending, in non-limiting examples. Instead of being produced in an elongate form similar to composite filaments, composite pellets may be characterized by an aspect ratio of about 5 or less and particle sizes having dimensions ranging from about 100 microns to about 5 cm. Composite pellets may feature a loading of piezoelectric particles in the polymer material similar to that of composite filaments, and once printed and poled, they may provide a similar range of $d_{33}$ values. Similarly, the piezoelectric particles may remain in a substantially non-agglomerated form in the composite pellets produced according to the disclosure herein.

Composite powders may be obtained by grinding, milling, pulverizing, or similar processes to produce non-elongate particulates having an irregular shape and a particle size of about 10 microns to about 1 mm, or about 10 microns to about 500 microns, or about 10 microns to about 100 microns.

Extrudable composite pastes may comprise a plurality of piezoelectric particles, a polymer material, and a sufficient amount of at least one solvent to promote extrusion at a temperature of interest. The solvent may be optional in some instances, particularly if at least one polymer precursor, such as at least one curable resin, is present in combination with the piezoelectric particles. The extrudable composite pastes may be monophasic, biphasic, or triphasic. When biphasic or higher, the piezoelectric particles and the polymer material may be present in one or both of the at least two immiscible phases. The polymer material and the piezoelectric particles may be processed into a composite, such as through melt blending and decreasing particle size as discussed above, wherein particles of the pre-made composite are present in at least one phase of the extrudable composite paste. Alternately, a polymer material may be at least partially dissolved in at least one phase of an extrudable composite paste, and distribution of the piezoelectric particles within at least a portion of the polymer material may take place as the extrudable composite paste is extruded into a desired shape when forming a printed part. For example, the piezoelectric particles may become distributed in the polymer material as the at least one solvent evaporates during printing of the extrudable composite pastes.

Optionally, the extrudable composite pastes may comprise a sol-gel material. When present, the sol-gel material may be included in an amount ranging from about 10 wt. % to about 20 wt. %, based on a combined mass of the extrudable composite paste. Inclusion of a sol-gel may result in a stiff matrix following curing, which may enhance the piezoelectric response obtained from the piezoelectric particles.

Suitable solvents that may be present in the extrudable composite pastes may include high-boiling solvents such as, but are not limited to, 1-butanol, 2-methyl-2-propanol, 1-pentanol, 3-methyl-1-butanol, 2,2-dimethyl-1-propanol, cyclopentanol, 1-hexanol, cyclohexanol, 1-heptanol, 1-octanol, propylene carbonate, tetraglyme, glycerol, 2-(2-methoxyethoxy)acetic acid or any combination thereof. Other high-boiling solvents having a boiling point in the range of about 100° C. to about 300° C. may be used as well. Suitable amounts of the at least one solvent may range from about 3 wt. % to about 35 wt. %, based on total mass of the extrudable composite paste.

In some embodiments, the extrudable composite pastes may be biphasic, in which case the at least one solvent may comprise water and a water-immiscible solvent. In non-limiting examples, an aqueous phase may comprise the water, a water-soluble polymer, and the piezoelectric particles, and an immiscible organic phase may comprise a non-water soluble polymer material and an optional organic solvent. When present, a sol-gel material may be present in the aqueous phase. The water-soluble polymer and the non-water soluble polymer material may be distributed co-continuously with one another, as described in more detail below.

The extrudable composite pastes may exhibit shear-thinning behavior, such that they may be readily extruded but quickly assume a fixed shape having a yield stress of about 100 Pa or greater upon being printed. In non-limiting examples, the extrudable composite pastes may have a viscosity of about 15,000 cP to about 200,000 cP when being sheared at a rate of about 5-10 s$^{-1}$.

When processed as a suitable form factor, printed parts having good piezoelectric performance may be obtained following printing. More particularly, the composites of the present disclosure may be capable of being printed as a single-layer thin film having a $d_{33}$ value, after poling, of about 1 pC/N or more at a film thickness of about 200 microns, as measured using an APC International Wide-Range $d_{33}$ meter. Thin film thicknesses are measured using standard techniques separately from the $d_{33}$ measurements. In more particular examples, the composites may be capable of forming single-layer thin films having a $d_{33}$ value, after poling, of about 1 pC/N to about 400 pC/N, or about 2 pC/N to about 200 pC/N, or about 3 pC/N to about 100 pC/N, or about 1 pC/N to about 75 pC/N, or about 5 pC/N to about 50 pC/N, or about 1 pC/N to about 10 pC/N, or about 2 pC/N to about 8 pC/N, or about 3 pC/N to about 10 pC/N, or about 1 pC/N to about 5 pC/N, or about 4 pC/N to about 7 pC/N under these conditions. The loading of piezoelectric particles and suitable blending conditions to maintain the piezoelectric particles as individuals once distributed within the polymer material may be selected to afford a desired extent of piezoelectricity. Single-layer film thicknesses that may be printable with the composites may range from about 10 µm to about 500 µm in thickness or about 25 µm to about 400 µm in thickness.

In order to display observable piezoelectric properties, a material such as a printed part or thin film, may be poled. Poling involves subjecting a material to a very high electric field so that dipoles of a piezoelectric material orient themselves to align in the direction of the applied field. Suitable poling conditions will be familiar to one having ordinary skill in the art. In non-limiting examples, poling may be conducted by corona poling, electrode poling or any combination thereof. In corona poling, a piezoelectric material is subjected to a corona discharge in which charged ions are generated and collect on a surface. An electric field is generated between the charged ions on the surface of a material and a grounded plane on the other side of the material. The grounded plane may be directly adhered to the material or present as a grounded plate. In the electrode poling (contact poling), two electrodes are placed on either side of a piezoelectric material, and the material is subjected to a high electric field generated between the two electrodes.

Although poling may be conducted as a separate step, as described above, poling may also be conducted in concert with an additive manufacturing process. In non-limiting examples, a high voltage may be applied between an extrusion nozzle supplying molten composite (formed from the composite filaments or composite pellets disclosed herein) and a grounded plane onto which the molten composite is being deposited to form a printed part.

Suitable piezoelectric particles for use in the present disclosure are not believed to be particularly limited, provided that the piezoelectric particles may be adequately blended with the polymer material, preferably remaining as individuals once blending with the polymer material has taken place. In the disclosure herein, the piezoelectric particles may interact non-covalently in at least one manner with the polymer material in order to realize enhancement of the piezoelectric response. The non-covalent interactions may include one or more of π-π bonding, hydrogen bonding, electrostatic interactions, or any combination thereof. The polymer material and/or the piezoelectric particles may be selected to promote one or more of these non-covalent interactions, or the piezoelectric particles may be further functionalized to promote a desired non-covalent interaction with a specified polymer material. For example, surface hydroxyl groups upon piezoelectric particles may be functionalized with a silane moiety having at least one aryl group appended thereto, which may form a π-π bond with a polymer material also bearing at least one aryl group. Other types of functionalization strategies for introducing an aryl group upon piezoelectric particles may be envisioned by one having ordinary skill in the art. Linker moieties attached to the surface of the piezoelectric particles may also be utilized to introduce functional groups capable of hydrogen bonding and/or interacting electrostatically with the polymer material.

Optionally, the piezoelectric particles may additionally be covalently bonded to the polymer material. Covalent bonding may take place between surface functional groups present upon the piezoelectric particles, such as surface hydroxyl groups, and the polymer material, or the surface functional groups may be further functionalized with a moiety bearing a functional group capable of reacting with the polymer material under specified conditions. Alternately, a bridging compound may facilitate covalent bonding between the piezoelectric particles and at least a portion of the polymer material. In some embodiments, a bridging compound may facilitate covalent bond formation or a suitable type of non-covalent interaction between the piezoelectric particles and the polymer material. Suitable bridging compounds may be bifunctional and contain a first functional group that is reactive with the piezoelectric particles and a second functional group that is reactive with or interacts non-covalently with the polymer material, examples of which will be familiar to persons having ordinary skill in the art. Metal-ligand coordinate covalent bonding also falls within the scope of covalent bonding in the disclosure herein (e.g., between a ligand upon the polymer material and a metal center upon the piezoelectric particles). Various strategies for promoting covalent bond formation may be contemplated by persons having ordinary skill in the art. When present, covalent bonding between the piezoelectric particles and the polymer material may also promote dispersion of the piezoelectric particles and enhancement of the piezoelectric properties.

Illustrative examples of piezoelectric materials that may be present in piezoelectric particles suitable for use herein include, but are not limited to, crystalline and non-crystalline ceramics, and naturally occurring piezoelectric materials. Suitable crystalline ceramics exhibiting piezoelectric properties may include, but are not limited to, lead zirconate titanate (PZT), potassium niobate, sodium tungstate, $Ba_2NaNNb_5O_5$, and $Pb_2KNb_5O_{15}$. Suitable non-crystalline ceramics exhibiting piezoelectric properties may include, but are not limited to, sodium potassium niobate, bismuth ferrite, sodium niobate, barium titanate, bismuth titanate, and sodium bismuth titanate. Particularly suitable examples of piezoelectric particles for use in the disclosure herein may include those containing, for instance, lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline and any combination thereof. Suitable dopants for lead zirconate titanate may include, but are not limited to Ni, Bi, La, and Nd.

Other suitable piezoelectric particles may include naturally occurring piezoelectric materials such as, for example, quartz crystals, cane sugar, Rochelle salt, topaz, tourmaline, bone, or any combination thereof. Still other examples of piezoelectric materials that may be used include, for example, ZnO, $BiFO_3$, and $Bi_4Ti_3O_{12}$.

The piezoelectric particles employed in the disclosure herein may have an average particle size in a micrometer or nanometer size range. In more particular examples, suitable piezoelectric particles may have a diameter of about 25 microns or less, or about 10 microns or less, such as about 1 micron to about 10 microns, or about 2 microns to about 8 microns. Smaller piezoelectric particles, such as those having an average particle size under 100 nm or an average particle size of about 100 nm to about 500 nm or about 500 nm to about 1 micron may also be utilized in the disclosure herein. Average particle sizes in the disclosure herein represent $D_{50}$ values, which refers to a diameter at which 50% of the sample (on a volume basis unless otherwise specified) is comprised of particles having a diameter less than said diameter. $D_{50}$ may also be referred to as the "average particle size." Such average particle size measurements may be made by analysis of optical images, including via SEM analysis, or using onboard software of a Malvern Mastersizer 3000 Aero S instrument, which uses light scattering techniques for particle size measurement.

Agglomeration refers to an assembly comprising a plurality of particulates that are loosely held together through physical bonding forces. Agglomerates may be broken apart through input of energy, such as through applying ultrasonic energy, to break the physical bonds. Individual piezoelectric particles that have been produced through de-agglomeration may remain de-agglomerated once blending with a polymer material has taken place. That is, defined agglomerates are not believed to re-form during the blending processes with a polymer material as disclosed herein. It is to be appreciated that two or more piezoelectric particles may be in contact with one another in a melt-blended piezoelectric composite, but the extent of interaction is less than that occurring in an agglomerate of piezoelectric particles. In non-limiting examples, agglomerates of piezoelectric particles may have a size ranging from about 100 microns to about 200 microns, and individual piezoelectric particles obtained after de-agglomeration may be in a size range of about 1 micron to about 5 microns or about 1 micron to about 10 microns, or any other size range disclosed above. The de-agglomerated piezoelectric particle sizes may be maintained following formation of a composite having a form factor specified in the present disclosure.

The polymer material in the compositions of the present disclosure may include at least one thermoplastic polymer and/or at least one polymer precursor that may be converted to a thermoplastic polymer or a covalently crosslinked polymer after blending piezoelectric particles therewith. Polymer precursors capable of forming thermoplastic polymers may undergo polymerization at any time after combining piezoelectric particles therewith, including before or after printing. Polymer precursors, such as curable resins, capable of forming crosslinked polymers, in contrast, may undergo polymerization by crosslinking after the composition has been printed into a desired shape. Suitable polymer precursors that may form a covalently crosslinked polymer may include various photocurable or thermally curable resins, numerous examples of which will be familiar to one having ordinary skill in the art. In addition, a thermoplastic polymer may contain a crosslinkable group that may be utilized to convert an initially thermoplastic polymer into a covalently crosslinked polymer after printing has taken place according to the disclosure herein.

Thermoplastic polymers suitable for use in the disclosure herein are not believed to be particularly limited, other than allowing piezoelectric particles to be sufficiently dispersed therein and containing complementary functionality for promoting a desired type of non-covalent interaction. In particular, the thermoplastic polymer may be a homopolymer or co-polymer containing functionality suitable to interact with surface functionality upon piezoelectric particles or one or more functional groups appended to the surface of piezoelectric particles. In the case of π-π bonding, for example, the piezoelectric particles and the thermoplastic polymer or copolymer may each contain at least one aryl group, such that the aryl groups in both locations interact with one another by π-π stacking interactions. In the case of hydrogen bonding, one of the piezoelectric particles and the thermoplastic polymer may contain a hydrogen bond donor and the other of the piezoelectric particles and the thermoplastic polymer may contain a hydrogen bond acceptor. For example, one of the piezoelectric particles and the thermoplastic polymer may contain hydroxyl or amine groups that may function as hydrogen bond donors, and the other of the piezoelectric particles and the thermoplastic polymer may contain an oxygen, nitrogen or fluorine atom that accepts a hydrogen bond from the hydrogen bond donor. In the case of electrostatic interactions, the piezoelectric particles and the thermoplastic polymer may contain oppositely charged functional groups, such that electrostatic charge pairing (ionic bonding) occurs between the two. For example, one of the piezoelectric particles and the thermoplastic polymer may contain a protonated amine or quaternary ammonium group, and the other of the piezoelectric particles and the thermoplastic polymer may contain a deprotonated carboxylic acid or sulfonic acid. Other types of suitable electrostatic interactions may include, for example, charge-dipole, dipole-dipole, induced dipole-dipole, charge-induced dipole, and the like.

In addition to facilitating distribution of the piezoelectric particles and being capable of interacting non-covalently in a suitable manner with the piezoelectric particles, the thermoplastic polymer may exhibit a melting point or softening temperature compatible with extrusion. In non-limiting examples, suitable thermoplastic polymers may exhibit a softening temperature or melting point sufficient to facilitate deposition at a temperature ranging from about 50° C. to about 400° C., or about 70° C. to about 275° C., or from about 100° C. to about 200° C., or from about 175° C. to about 250° C. Melting points may be determined using ASTM E794-06 (2018) with a 10° C. ramping and cooling rate, and softening temperatures may be determined using ASTM D6090-17.

Illustrative examples of suitable thermoplastic polymers may include those commonly employed in fused filament fabrication such as, for instance, a polyamide, a polycaprolactone, a polylactic acid, a poly(styrene-isoprene-styrene) (SIS), a poly(styrene-ethylene-butylene-styrene) (SEBS), a poly(styrene-butylene-styrene) (SBS), a high-impact polystyrene (HIPS), polystyrene, a thermoplastic polyurethane, a poly(acrylonitrile-butadiene-styrene) (ABS), a polymethylmethacrylate, a poly(vinylpyrrolidine-vinylacetate), a polyester (e.g., polyethylene terephthalate (PET), polyethylene naphthalate (PEN), polyethylene terephthalate glycol (PETG), and the like), a polycarbonate, a polyethersulfone, a polyoxymethylene, a polyether ether ketone, a polyether aryl ketone, a polyetherimide, a polyethylene, a polyethylene oxide, a polyphenylene sulfide, a polypropylene, a polystyrene, a polyvinyl chloride, polyphenylene ethers (PPE), a poly(tetrafluoroethylene), a poly(vinylidene fluoride), a poly(vinylidene fluoride-hexafluoropropylene), any copolymer thereof, and any combination thereof. When needed for promoting a given non-covalent interaction and not already present in a specified parent polymer, a co-monomer may be included that contains a functional group capable of facilitating at least one non-covalent interaction according to the disclosure herein, such as a co-monomer containing at least one aryl group, a hydrogen bond donor, a hydrogen bond acceptor, or a charged group. Grafting of such functional groups onto the backbone of a preformed polymer may also take place in some instances. It should be appreciated that some of the polymers and co-polymers listed herein may already contain a functional group capable of promoting at least one non-covalent interaction. Thus, depending on the type of polymer and the type of non-covalent interaction desired, an additional co-monomer may or may not need to be included. Other suitable thermoplastic polymers that may be present in the compositions disclosed herein include, for example, polylactic acid, polyvinylpyrrolidone-co-polyvinyl acetate (PVP-co-PVA), copolymers thereof, and the like. Some examples of the composites disclosed herein may include a suitable thermoplastic polymer that is itself non-piezoelectric. In particular examples, some composites disclosed herein may comprise a thermoplastic polymer other than polyvinylidene fluoride.

In some embodiments, the composites may comprise at least one polymer precursor that is a curable resin that may be converted to a covalently crosslinked polymer after or during the course of forming a printed part with the composites. To maintain extrudability, form factors containing one or more curable resins may further comprise one or more thermoplastic polymers as well, such as one or more of the thermoplastic polymers listed above. After curing, the at least one curable resin may form a covalently crosslinked polymer matrix within the at least one thermoplastic polymer. Suitable curable resins may include photocurable resins, thermally curable resins, or any combination thereof. A photoinitiator or thermal initiator may be included when a photocurable resin or thermally curable resin is present.

In some embodiments, the polymer material within the composites may comprise a first polymer material and a second polymer material, wherein the first polymer material and the second polymer material are immiscible with each other. A number of benefits and features may be realized by having a first polymer material and a second polymer material that are immiscible. In some instances, the piezoelectric particles may be substantially localized within one of the first polymer material or the second polymer material or at an interface between the first polymer material and the second polymer material, thereby effectively increasing the local concentration of the piezoelectric particles in the composites. In some or other embodiments, one of the first polymer material or the second polymer material may be dissolvable or degradable under specified conditions, whereas the other of the first polymer material and the second polymer material is not. Optionally, non-polymeric materials that are dissolvable or degradable may be utilized to accomplish a similar result. Upon dissolving or degrading one of the first polymer material or the second polymer material (or a non-polymeric dissolvable or degradable material that may be processed into an extrudable composite in combination with a polymer material), a composite having porosity defined therein may be realized. Optionally, the porosity may be backfilled with a material differing from the polymer material (or non-polymeric material) that was removed by degradation or dissolution. If the first polymer material and the second polymer material are distributed co-continuously, as discussed further below, a porous composite having a plurality of interconnected pores may be obtained. Alternately, a first polymer material and a second polymer material, in which neither polymer material is dissolvable or degradable, may be distributed co-continuously, optionally with piezoelectric particles substantially localized in one of the first polymer material or the second polymer material in the resulting co-continuous polymer matrix.

When porosity is introduced into a composite of the present disclosure, the porosity may be backfilled with material for further modifying the properties of the composite. In non-limiting examples, the porosity may by backfilled with electrically conductive particles including, but are not limited to, high-conductivity metal particles such as silver, copper, aluminum, gold, and the like; and electrically conductive carbon materials such as carbon black, carbon fibers, carbon nanofibers, graphene, carbon nanotubes, and the like. Illustrative forms for electrically conductive particles may include, for example, nanoparticles, nanoflakes, nanowires, nanorods, microflakes, and the like. Additional materials that may be used for backfilling include, for example, a polymer differing from the polymer that was removed, thermally conductive particles, reinforcement fibers, colorants, stabilizers, plasticizers, and the like. Such backfilling materials may be introduced in a liquid solution or dispersion, which is subsequently evaporated once backfilling has taken place. Alternately, a low viscosity polymer or low-viscosity curable resin may be utilized instead of a liquid solution or dispersion to promote delivery of the backfilling materials.

Other suitable materials for backfilling may include, for example, nanocrystalline cellulose, cellulose nanofibrils, silica, silica-alumina, alumina such as (pseudo)boehmite, gibbsite, titania, zirconia, cationic clays or anionic clays such as saponite, bentonite, kaoline, sepiolite, hydrotalcite, and the like. Other suitable backfilling materials may also include metal oxides such as alumina trihydrate (ATH), alumina monohydrate, magnesium hydroxide, magnesium silicate, talc, silicas such as fumed silica and precipitated silica, and calcium carbonate, calcium metasilicate, Wollastonite, Dolomite, Perlite, hollow glass spheres, kaolin, and the like. UV stabilizers such as titanium oxide, zinc oxide, benzophenones, benzotriazoles, aryl esters, sterically hindered amines, the like, and any combination thereof may also be present.

Composites of the present disclosure may comprise a continuous polymer phase comprising first and second polymer materials, such as first and second thermoplastic polymers, that are immiscible with one another, wherein one of the polymer materials is dissolvable or degradable and may be at least partially removed from the other polymer material under specified conditions, thereby introducing porosity to the composite or printed part formed therefrom. The term "continuous polymer phase" refers to the bulk phase in which the piezoelectric particles are dispersed in at least a portion of the polymer matrix. A continuous polymer phase may contain the first and second polymer materials distributed co-continuously or non-co-continuously within one another. In a co-continuous distribution of the first and second polymer materials, the first and second polymer materials may exist as separate, continuous polymer phases that are interblended with each other. That is, the first and second polymer materials may define an interpenetrating network of the polymer materials, wherein there is connectivity between at least a majority of the first polymer material and connectivity between at least a majority of the second polymer material throughout the continuous polymer phase. In a non-co-continuous distribution of the first and second polymer materials, in contrast, isolated pockets of one of the polymer materials may exist in a continuous matrix of the other. Thus, in a co-continuous distribution, any cross-section of the composite contains at least some of both the first polymer material and the second polymer material. Composites containing regions that are separately co-continuous or non-co-continuous also are within the scope of the present disclosure.

When two polymer materials are immiscible, removal of one of the polymer materials may afford controlled porosity or channel introduction into a printed part or a composite form factor used to produce a printed part. Very fine porosity features may be realized, much smaller than those that might be attainable through direct printing. In non-limiting examples, one of the polymer materials may be a water-soluble thermoplastic polymer and the other polymer material may be is a water-insoluble thermoplastic polymer. In other instances, one of the polymer materials is dissolvable in an organic solvent and the other polymer material is not soluble in the same organic solvent (but may be soluble in a different organic solvent). In still other instances, one of the polymer materials may be degraded to byproducts that separate from the composite, wherein conditions promoting degradation do not impact the other polymer material. Degradation by melting which removes one of the polymer materials from the other also resides within the scope of the present disclosure. By altering the ratio of the immiscible polymer materials in the composite, the extent of porosity may be regulated to a desired degree. As indicated above, a non-polymeric material that is dissolvable or degradable under specified conditions may similarly be utilized to introduce porosity within a composite form factor or a printed part formed therefrom.

It is to be appreciated that the first polymer material and the second polymer material need not necessarily comprise a single polymer material of each type. Thus, depending on application-specific needs, the first polymer material may comprise one or more polymer materials, such as two or more thermoplastic polymers that are dissolvable or degradable under specified conditions, and the second polymer material may comprise one or more polymer materials, such as two or more thermoplastic polymers that are non-dissolvable or non-degradable under the specified conditions.

Advantageously, piezoelectric particles may remain substantially associated with or localized in the polymer material that remains undissolved or non-degraded, thus experiencing minimal loss when the dissolvable or degradable polymer material is removed (e.g., through exposure to an appropriate solvent or other conditions that may promote removal of one or more thermoplastic polymers in preference to another). Accordingly, a porous network of the piezoelectric particles distributed in the remaining polymer material (e.g., an insoluble or non-degradable thermoplastic polymer) may be realized after printing and further processing according to the disclosure herein. The porous network may comprise a plurality of interconnected pores. The piezoelectric particles may be uniformly distributed in the remaining polymer material and have a higher effective concentration therein than in the as-produced composite.

Advantageously, composites capable of forming printed parts containing piezoelectric particles may be formulated using a room temperature aqueous-based process employing a water-soluble polymer. Polyvinyl alcohol (PVA), polyethylene glycol (PEG, also known as polyethylene oxide), or any combination thereof may be combined with piezoelectric particles in an aqueous phase containing a second polymer material (e.g., a second thermoplastic polymer) that is suspended in the aqueous phase and with which the water-soluble polymer is immiscible. After removal of the water from the combined aqueous phase, the two polymer materials may form a continuous polymer phase, in which the two polymer materials remain mutually immiscible with one another, and in which the piezoelectric particles are distributed throughout the continuous polymer phase while being substantially localized in the second polymer material (i.e., the water-insoluble thermoplastic polymer) or at an interface between the first polymer material and the second polymer material. In one example, the continuous polymer phase containing the piezoelectric particles may be obtained as a cast film before being processed into a final form factor, such as those specified above, wherein the piezoelectric particles remain substantially localized within the second polymer material in the resulting composite forms and printed parts formed therefrom. Therefore, once formed into a printed part, the first polymer material may be removed to afford a porous polymer network but without releasing substantial quantities of the piezoelectric particles.

In some examples, the first polymer material may be a water-soluble thermoplastic polymer and the second polymer material may be a water-insoluble thermoplastic polymer. Examples of water-soluble thermoplastic polymers suitable for use in the disclosure herein may include, for example, polyvinyl alcohol, polyethylene glycol, any copolymer thereof, or any combination thereof. Some or other examples of suitable water-soluble thermoplastic polymers may include, but are not limited to, a polyvinylpyrrolidone, a polyoxazoline (e.g., poly(2-ethyl-2-oxazoline)), a cellulose ester, a polylactic acid, a polylactate, a polycaprolactone, any copolymer thereof, or any combination thereof. Solubility or degradation in aqueous acid solutions is also included within the scope of water solubility in the disclosure herein. Polylactic acid may be effectively degraded through contact with an aqueous acid. Polylactic acid may also be used effectively as a non-degradable thermoplastic polymer in the disclosure herein (i.e., as a build material), provided that the composite or a printed part formed therefrom is only exposed to conditions chosen so as not to degrade the polylactic acid (i.e., non-acidic conditions). Similar considerations apply to polyesters like polycaprolactones, which may likewise be degradable under aqueous acid conditions but may be suitably used as a second polymer material if the first polymer material is removed under conditions that do not promote their degradation.

When a first polymer material and a second polymer material are combined to form a co-continuous phase, particularly a co-continuous phase containing a dissolvable or degradable thermoplastic polymer and a non-dissolvable or non-degradable thermoplastic polymer, containing piezoelectric particles, the ratio of the first polymer material to the second polymer material may vary over a wide range. In non-limiting examples, a ratio of the first polymer material to the second polymer material may range from about 1:99 to about 99:1 by volume. In more specific examples, the ratio of the first polymer material to the second polymer material may range from about 10:90 to about 90:10, or about 20:80 to about 80:20, or about 30:70 to about 70:30, or about 40:60 to about 60:40, or about 10:90 to about 20:80, or about 20:80 to about 30:70, or about 30:70 to about 40:60, or about 40:60 to about 50:50, or about 50:50 to about 60:40, or about 60:40 to about 70:30, or about 70:30 to about 80:20, or about 80:20 to about 90:10. The ratio of the first polymer material to the second polymer material may be selected such that a desired extent of flexibility is realized once a printed part is formed and the first polymer material is removed, or to tailor the extent of porosity formed in a printed part.

After removal of at least a portion of a first polymer material from a printed part, the printed parts may have a degree of porosity commensurate with the amount of the first polymer material that is removed. In non-limiting embodiments, the printed parts may have a porosity ranging from about 5% to about 80%, or about 10% to about 50%, or about 30% to about 70%, based upon the amount of mass removed relative to the total mass of a printed part prior to removal of the first polymer material. The pore size or the channel size of interconnected pores may depend upon the extent of dispersion of the first polymer material in the continuous polymer phase, as well as the amount of the first polymer material that is removed.

Once a first polymer material has been at least partially removed from a printed part, the piezoelectric particles may be present in a printed polymer matrix comprising the second polymer material (the remaining thermoplastic polymer) at a particle:polymer mass ratio of about 20:80 to about 97:3, based on total mass of the part following removal of the first polymer material. These values correspond to a particle:polymer volume percentage ranging from about 2 vol. % to about 80 vol. %.

Preferably, at least a majority of the piezoelectric particles may be localized in the second polymer material in the continuous polymer phase defining the composite or at an interface with the first polymer material. The extent of localization with and/or association between the piezoelectric particles and the second polymer material may be determined based upon the amount of piezoelectric particles lost upon dissolution or degradation of the first polymer material. The piezoelectric particles may be distributed substantially as individuals in the second polymer material. In non-limiting examples, at least about 80%, at least about 85%, at least about 90%, or at least about 95% of the piezoelectric particles originally blended with the continuous polymer phase may remain associated with the second polymer material once the first polymer material has been removed.

In fused filament fabrication processes utilizing composite filaments disclosed herein, the print head may contain one or more extruders, such that a first polymer filament comprising a build material is deposited from a first extruder. The build material may comprise a composite filament in accordance with the disclosure above. Optionally, a second polymer filament comprising a removable support material may be deposited from a second extruder to form a removable support for defining one or more overhangs in a printed part formed from the build material. Filaments (composite filaments or non-composite filaments) suitable for use in the foregoing manner may range from about 0.5 mm to about 10 mm in diameter, or about 1 mm to about 5 mm in diameter, particularly about 1.5 mm to about 3.5 mm in diameter. Standard filament diameters for many three-dimensional printers employing fused filament fabrication technology are 1.75 mm or 2.85 mm (about 3.0 mm). It is to be recognized that any suitable filament diameter may be used in accordance with the disclosure herein, provided that the filament is compatible with a user's particular printing system. Similarly, the length and/or color of the composite filaments is/are not believed to be particularly limited in the printing processes disclosed herein. Preferably, the composite filaments disclosed herein and utilized in processes for forming a printed part are continuous and of spoolable length, such as at least about 1 foot, or at least about 5 feet, or at least about 10 feet, or at least about 25 feet, or at least about 50 feet, or at least about 100 feet, or at least about 250 feet, or at least about 500 feet, or at least about 1000 feet. The term "spoolable length" means sufficiently long to be wound on a spool or reel. It is to be appreciated that a composite filament of "spoolable length" need not necessarily be spooled, such as when the composite filament is too rigid to be wound onto a spool.

Accordingly, composite filaments produced according to the disclosure herein may have a diameter and length compatible for use in fused filament fabrication additive manufacturing processes. Particularly suitable examples may include composite filament diameters ranging from about 1 mm to about 10 mm. Various filament processing conditions may be utilized to adjust the filament diameter, as explained hereinafter.

Suitable methods for forming composite filaments compatible with fused filament fabrication may take place through melt blending of at least one polymer material and a plurality of piezoelectric particles, which may include melt mixing with stirring, followed by extrusion, or direct extrusion with a twin-screw extruder. More specific melt blending methods may comprise combining at least one thermoplastic polymer and a plurality of piezoelectric particles, forming a melt comprising the thermoplastic polymer and the piezoelectric particles, blending the melt, optionally with stirring, to form a melt blend comprising the piezoelectric particles distributed therein, and extruding the melt blend to form a composite filament comprising the piezoelectric particles mixed in a substantially non-agglomerated form with the at least one thermoplastic polymer. Composite pellets of the present disclosure may be formed in a similar manner, but without extruding directly into a filament form. Instead, the composite may be extruded into a larger diameter fiber that may be cut, shredded, pulverized, ground, or the like to afford composite pellets having a similar morphology to the composite filaments.

In further embodiments, the melt blend may be additionally processed before extruding takes place (e.g., in instances where melt blending takes place prior to extrusion). In particular, the melt blend may be cooled and solidified (e.g., below the melting point or softening temperature of a thermoplastic polymer), and cryogenically milling the melt blend after solidifying and prior to extruding the melt blend. Cryogenic milling will be familiar to one having ordinary skill in the art and may be conducted to reduce the particle size of the melt blend with lower risk of localized heating of the thermoplastic polymer and/or the piezoelectric particles taking place and promoting degradation thereof. Although cryogenic milling may be advantageous, it is to be appreciated that non-cryogenic milling may also be conducted, or the melt blend may be extruded directly without being cooled and solidified first in alternative process variations. Shredding or grinding of the melt blend may also be conducted prior to extrusion as an alternative process variation. In some instances, composite pellets or composite powders may likewise be obtained without proceeding through a secondary extrusion process.

In some or other embodiments, melt blending methods for forming composites may include de-agglomeration of a piezoelectric material. In particular, piezoelectric particles employed to form the melt blends may be obtained by probe sonication, specifically probe sonication of larger piezoelectric particles or agglomerates thereof, wherein the input of sonic energy promotes de-agglomeration and formation of a reduced particle size. In more specific examples, PZT particles or similar piezoelectric particles processed by probe sonication may have an average particle size of about 10 microns or less, such as a particle size ranging from about 1 micron to about 5 microns, or about 1 micron to about 2 microns. Even smaller piezoelectric particles may be produced in some instances. These piezoelectric particle sizes may be maintained in the composites disclosed herein, with the piezoelectric particles remaining in a substantially non-agglomerated form once blended with a polymer material to define a composite. Other suitable techniques for de-agglomerating piezoelectric particles may include homogenization, ball milling, or the like.

Additive manufacturing processes described herein may comprise providing a composition of the present disclosure, specifically a composite filament, a composite pellet, composite powder, or a composite paste, and forming a printed part by depositing the composition layer-by-layer. Suitable layer-by-layer deposition techniques will be familiar to one having ordinary skill in the art and may be selected based upon the chosen form of the composite. In non-limiting examples, suitable layer-by-layer deposition techniques may include fused filament fabrication, direct writing, or any combination thereof. When the polymer material comprises at least one thermoplastic polymer, the composition may be heated at or above a melting point or softening temperature of the at least one thermoplastic polymer when forming the printed part. Thus, once the at least one thermoplastic polymer cools, a printed part having a specified shape may be realized. When the polymer material comprises at least one polymer precursor, forming the printed part may further comprise polymerizing or curing the at least one polymer precursor, such as through forming a covalently crosslinked polymer matrix within the at least one thermoplastic polymer. Curing may take place by, for example, thermal curing or photocuring, following formation of a printed part, thereby forming a crosslinked polymer. Optionally, porosity may be introduced in a printed part, as discussed in further detail above. Poling at least a portion of the printed part may also take place to induce a piezoelectric response therein.

Embodiments disclosed herein include:

A. Compositions comprising piezoelectric particles. The compositions comprise: a plurality of piezoelectric particles dispersed in at least a portion of a polymer material; wherein the piezoelectric particles interact non-covalently with the polymer material via $\pi$-$\pi$ bonding, hydrogen bonding, electrostatic interactions stronger than van der Waals interactions, or any combination thereof.

A1. Printed parts comprising the composition of A.

B. Additive manufacturing processes. The processes comprise: providing the composition of A, and forming a printed part by depositing the composition layer-by-layer.

Each of embodiments A, A1, and B may have one or more of the following additional elements in any combination:

Element 1: wherein the polymer material and the piezoelectric particles collectively define an extrudable material that is a composite having a form factor selected from the group consisting of a composite filament, a composite pellet, a composite powder, and a composite paste.

Element 2: wherein the piezoelectric particles are uniformly dispersed in at least a portion of the polymer material.

Element 3: wherein the piezoelectric particles comprise about 10 vol. % to about 85 vol. % of the composite.

Element 4: wherein the polymer material and the piezoelectric particles collectively define an extrudable material that is a composite filament.

Element 5: wherein the piezoelectric particles are substantially non-agglomerated when combined with the polymer material.

Element 6: wherein the piezoelectric particles have an average particle size of about 10 microns or less.

Element 7: wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline and any combination thereof.

Element 8: wherein the polymer material comprises at least one thermoplastic polymer.

Element 9: wherein the at least one thermoplastic polymer comprises at least one monomer that undergoes $\pi$-$\pi$ bonding, hydrogen bonding, electrostatic interactions, or any combination thereof with the piezoelectric particles.

Element 10: wherein the polymer material further comprises at least one polymer precursor.

Element 10A: wherein the polymer material further comprises at least one polymer precursor, and forming the printed part further comprises polymerizing or curing the at least one polymer precursor.

Element 11: wherein the at least one polymer precursor comprises at least one curable resin that is photocurable or thermally curable to form a covalently crosslinked polymer.

Element 11A: wherein the at least one polymer precursor comprises at least one curable resin that is photocurable or thermally curable to form a covalently crosslinked polymer, and at least a portion of the printed part is cured by exposure to electromagnetic radiation or thermal curing conditions.

Element 12: wherein the piezoelectric particles and the polymer material interact non-covalently at least by $\pi$-$\pi$ bonding.

Element 13: wherein the piezoelectric particles and the polymer material interact non-covalently at least by a charge-charge interaction.

Element 14: wherein the piezoelectric particles are covalently functionalized with a moiety that undergoes $\pi$-$\pi$ bonding, hydrogen bonding, electrostatic interactions, or any combination thereof with the polymer material.

Element 15: wherein the polymer material comprises a first polymer material and a second polymer material that are immiscible with each other.

Element 16: wherein the first polymer material and the second polymer material collectively define a co-continuous polymer matrix.

Element 17: wherein the piezoelectric particles are substantially localized in one of the first polymer material or the second polymer material.

Element 18: wherein a plurality of interconnected pores is present in the polymer material.

Element 19: wherein the polymer material comprises at least one thermoplastic polymer and the composition is heated at or above a melting point or softening temperature of the at least one thermoplastic polymer when forming the printed part.

Element 20: wherein the process further comprises: poling at least a portion of the printed part.

Element 21: wherein the polymer material and the piezoelectric particles collectively define an extrudable material that is a composite filament, and forming the printed part comprises a fused filament fabrication process.

By way of non-limiting example, exemplary combinations applicable to A, A1, and B include, but are not limited to: 1 or 4, and 2; 1 or 4, and 3; 1 or 4, and 5; 1 or 4, and 6; 1 or 4, and 7; 1 or 4, and 8; 1 or 4, and 8 and 9; 1 or 4, and 10 or 10A; 1 or 4, 10 or 10A, and 11 or 11A; 1 or 4, and 12 and/or 13; 1 or 4, and 14; 1 or 4, and 15; 1 or 4, and 15 and 16; 1 or 4, and 15 and 17; 1 or 4, and 18; 2 and 3; 2 and 5; 2 and 6; 2 and 7; 2 and 8; 2, 8 and 9; 2, and 10 or 10A; 2, 10 or 10A, and 11 or 11A; 2, and 12 and/or 13; 2 and 14; 2 and 15; 2, 15 and 16; 2, 15 and 17; 2 and 18; 3 and 2; 3 and 5; 3 and 6; 3 and 7; 3 and 8; 3, 8 and 9; 3, and 10 or 10A; 3, 10 or 10A, and 11 or 11A; 3, and 12 and/or 13; 3 and 14; 3 and 15; 3, 15 and 16; 3, 15 and 17; 3 and 18; 5 and 6; 5 and 7; 5 and 8; 5, 8 and 9; 5, and 10 or 10A; 5, 10 or 10A, and 11 or 11A; 5, and 12 and/or 13; 5 and 14; 5 and 15; 5, 15 and 16; 5, 15 and 17; 5 and 18; 6 and 7; 6 and 8; 6, 8 and 9; 6, and 10 or 10A; 6, 10 or 10A, and 11 or 11A; 6, and 12 and/or 13; 6 and 14; 6 and 15; 6, 15 and 16; 6, 15 and 17; 6 and 18; 7 and 8; 7, 8 and 9; 7, and 10 or 10A; 7, 10 or 10A, and 11 or 11A; 7, and 12 and/or 13; 7 and 14; 7 and 15; 7, 15 and 16; 7, 15 and 17; 7 and 18; 8 and 9; 8, and 10 or 10A; 8, 10 or 10A, and 11 or 11A; 8, and 12 and/or 13; 8 and 14; 8 and 15; 8, 15 and 16; 8, 15 and 17; 8 and 18; 10 or 10A, and 11 or 11A; 10 or 10A, and 12 and/or 13; 10 or 10A, and 14; 10 or 10A, and 15; 10 or 10A, 15 and 16; 10 or 10A, 15 and 17; 10 or 10A, and 18; 12 and 13; 12 and 14; 12 and 15; 12 and 16; 12 and 17; 12 and 18; 13 and 14; 13 and 15; 13 and 16; 13 and 17; 13 and 18; 14 and 15; 14 and 16; 14 and 17; 14 and 18; 15 and 16; 15 and 17; and 15 and 18. Any of the foregoing may be in further combination with one or more of 19, 20, or 21.

CLAUSES OF THE DISCLOSURE

The present disclosure is further directed to the following non-limiting clauses:

Clause 1. A composition comprising:
a plurality of piezoelectric particles dispersed in at least a portion of a polymer material;
wherein the piezoelectric particles interact non-covalently with the polymer material via $\pi$-$\pi$ bonding, hydrogen bonding, electrostatic interactions stronger than van der Waals interactions, or any combination thereof.

Clause 2. The composition of clause 1, wherein the polymer material and the piezoelectric particles collectively define an extrudable material that is a composite having a form factor selected from the group consisting of a composite filament, a composite pellet, a composite powder, and a composite paste.

Clause 3. The composition of clause 1 or clause 2, or the composition of clause 2, wherein the piezoelectric particles are uniformly dispersed in at least a portion of the polymer material.

Clause 4. The composition of any one of clauses 1-3, or the composition of clause 2, wherein the piezoelectric particles comprise about 10 vol. % to about 85 vol. % of the composite.

Clause 5. The composition of any one of clauses 1-4, or the composition of clause 1, wherein the polymer material and the piezoelectric particles collectively define an extrudable material that is a composite filament.

Clause 6. The composition of any one of clauses 1-5, or the composition of clause 1, wherein the piezoelectric particles are substantially non-agglomerated when combined with the polymer material.

Clause 7. The composition of any one of clauses 1-6, or the composition of clause 1, wherein the piezoelectric particles have an average particle size of about 10 microns or less.

Clause 8. The composition of any one of clauses 1-7, or the composition of clause 1, wherein the piezoelectric particles comprise a piezoelectric material selected from the group consisting of lead zirconate titanate, doped lead zirconate titanate, barium titanate, lead titanate, strontium titanate, barium strontium titanate, lead magnesium niobate, lead magnesium niobate-lead titanate, sodium potassium niobate, calcium copper titanate, bismuth sodium titanate, gallium phosphate, quartz, tourmaline and any combination thereof.

Clause 9. The composition of any one of clauses 1-8, or the composition of clause 1, wherein the polymer material comprises at least one thermoplastic polymer.

Clause 10. The composition of clause 9, wherein the at least one thermoplastic polymer comprises at least one monomer that undergoes $\pi$-$\pi$ bonding, hydrogen bonding, electrostatic interactions, or any combination thereof with the piezoelectric particles.

Clause 11. The composition of clause 9, wherein the polymer material further comprises at least one polymer precursor.

Clause 12. The composition of clause 11, wherein the at least one polymer precursor comprises at least one curable resin that is photocurable or thermally curable to form a covalently crosslinked polymer.

Clause 13. The composition of any one of clauses 1-12, or the composition of clause 1, wherein the piezoelectric particles and the polymer material interact non-covalently at least by $\pi$-$\pi$ bonding.

Clause 14. The composition of any one of clauses 1-13, or the composition of clause 1, wherein the piezoelectric particles and the polymer material interact non-covalently at least by a charge-charge interaction.

Clause 15. The composition of any one of clauses 1-14, or the composition of clause 1, wherein the piezoelectric particles are covalently functionalized with a moiety that undergoes $\pi$-$\pi$ bonding, hydrogen bonding, electrostatic interactions, or any combination thereof with the polymer material.

Clause 16. The composition of any one of clauses 1-15, or the composition of clause 1, wherein the polymer material comprises a first polymer material and a second polymer material that are immiscible with each other.

Clause 17. The composition of clause 16, wherein the first polymer material and the second polymer material collectively define a co-continuous polymer matrix.

Clause 18. The composition of clause 16 or clause 17, or the composition of clause 16, wherein the piezoelectric particles are substantially localized in one of the first polymer material or the second polymer material.

Clause 19. The composition of any one of clauses 1-18, or the composition of clause 1, wherein a plurality of interconnected pores is present in the polymer material.

Clause 20. An additive manufacturing process comprising: providing the composition of any one of clauses 1-19, or the composition of clause 1; and forming a printed part by depositing the composition layer-by-layer.

Clause 21. The additive manufacturing process of clause 20, wherein the polymer material comprises at least one thermoplastic polymer and the composition is heated at or above a melting point or softening temperature of the at least one thermoplastic polymer when forming the printed part.

Clause 22. The additive manufacturing process of clause 21, wherein the at least one thermoplastic polymer comprises at least one monomer that undergoes $\pi$-$\pi$ bonding, hydrogen bonding, electrostatic interactions, or any combination thereof with the piezoelectric particles.

Clause 23. The additive manufacturing process clause 21 or clause 22, or the additive manufacturing process of clause 21, wherein the polymer material further comprises at least one polymer precursor, and forming the printed part further comprises polymerizing or curing the at least one polymer precursor.

Clause 24. The additive manufacturing process of clause 23, wherein the at least one polymer precursor comprises at least one curable resin that is photocurable or thermally curable to form a covalently crosslinked polymer, and at least a portion of the printed part is cured by exposure to electromagnetic radiation or thermal curing conditions.

Clause 25. The additive manufacturing process of any one of clauses 20-24, or the additive manufacturing process of clause 20, wherein the piezoelectric particles are substantially non-agglomerated when combined with the polymer material.

Clause 26. The additive manufacturing process of any one of clauses 20-25, or the additive manufacturing process of clause 20, wherein the piezoelectric particles have an average particle size of about 10 microns or less.

Clause 27. The additive manufacturing process of any one of clauses 20-26, or the additive manufacturing process of clause 20, further comprising:
poling at least a portion of the printed part.

Clause 28. The additive manufacturing process of any one of clauses 20-27, or the additive manufacturing process of clause 20, wherein the polymer material and the piezoelectric particles collectively define an extrudable material that is a composite filament, and forming the printed part comprises a fused filament fabrication process.

Clause 29. The additive manufacturing process of any one of clauses 20-28, or the additive manufacturing process of clause 20, wherein the piezoelectric particles and the polymer material non-covalently interact at least by $\pi$-$\pi$ bonding.

Clause 30. The additive manufacturing process of any one of clauses 20-29, or the additive manufacturing process of clause 20, wherein the piezoelectric particles and the polymer material interact non-covalently at least by a charge-charge interaction.

Clause 31. A printed part comprising the composition of any one of clauses 1-19, or the composition of clause 1.

To facilitate a better understanding of the present disclosure, the following examples of preferred or representative embodiments are given. In no way should the following examples be read to limit, or to define, the scope of the invention.

EXAMPLES

Lead zirconate titanate (PZT, APC International, Ltd.) was sonicated using a Branson digital probe sonicator for 30 minutes in water at 25% amplitude to break up particle agglomerates. The original PZT agglomerate size of approximately 100 microns afforded PZT particles in a 1-5 micron size range following sonication, with a majority of the PZT particles being in a 1-2 micron size range. The PZT particles were dried at 80° C. overnight in a vacuum oven.

Alternately, a suspension of PZT particles in water (250 g PZT particles in 250 g water) was homogenized under high-shear conditions for 30 minutes using an IKA ULTRA-TURRAX T25 homogenizer. The PZT particles were isolated by centrifugation, washed with isopropanol, and dried at 80° C. in a vacuum oven overnight.

In some instances, PZT particles were further functionalized upon their surface with phenyl groups, as described in further detail below in Example 1.

Functionalized and unfunctionalized PZT particles were blended with two different polyolefins having phenyl side chains. In one instance, the polymer was KRATON G1657 M, a linear triblock styrene/ethylene/butylene/styrene copolymer (SEBS) having a melt flow index (MFI) of 22 g/10 minutes (230° C./5 kg). In another instance, the polymer was KRATON D1162, a linear triblock styrene/isoprene/styrene copolymer (SIS) having a MFI of 45 g/10 min (200° C./5 kg).

PZT particles were also functionalized in situ upon their surface with amine groups (PZT-NH$_2$) while blending with a polyamide, as described in further detail below in Example 4.

Example 1: Functionalization of PZT Particles with Phenyl Groups (PZT-pH). Functionalization was conducted by combining 50 g PZT with 450 mL isopropanol and 50 mL deionized water in a 1000 mL beaker and sonicating with a probe sonicator in pulse mode with further magnetic stirring for 45 minutes. Pulsing was conducted at 50% amplitude in 1 second intervals, with a 0.5 second interval between pulses. Alternately, de-agglomeration may be conducted as above.

Following sonication, the mixture was transferred to a 1000 mL round bottom flask, and 25 g of N-(3-(trimethoxysilyl)propyl)aniline (TPA) was added. The reaction mixture was stirred overnight at room temperature and then heated to 80° C. for 3 hours with magnetic stirring. After cooling to room temperature, the functionalized PZT particles were isolated by centrifugation and washed twice with isopropanol. The functionalized PZT particles (PZT-Ph) were then dried at 60° C. overnight.

The PZT-Ph particles were further characterized by infrared spectroscopy, thermogravimetric analysis, and carbon/hydrogen/nitrogen analyses. Based upon these analyses the incorporation of N-(3-(trimethoxysilyl)propyl)aniline was determined at 2.6 wt. %, based on total mass (10.3 mmol silane per 100 g PZT particles). FIG. 3 is an illustrative overlay of FTIR spectra of PZT particles and PZT-Ph particles. As shown, the FTIR spectrum of unfunctionalized PZT particles was largely featureless, except for a large peak near 510 cm$^{-1}$, corresponding to metal-O-metal bonds. This peak was maintained in the FTIR spectrum of PZT-Ph particles, which also showed ingrowth of additional peaks at 1600 cm$^{-1}$, 1506 cm$^{-1}$, and 1093 cm$^{-1}$ corresponding to the appended phenyl group.

Example 2: Formation of a 40 vol. % PZT-Ph/SEBS Composite. PZT-Ph was combined with SEBS at 40 vol. %, based on total volume, and the resulting mixture was blended in a Haake compounder at 230° C. Blending was conducted by placing 27.3 g of SEBS pellets in the Haake compounder and melting under mixing conditions. 153.4 g PZT-Ph particles were then combined with the molten SEBS. After 10-15 minutes of blending, the mixture was discharged onto an aluminum pan and cooled to ambient temperature.

Comparative Example 2: Formation of a 40 vol. % PZT/SEBS Composite. This composite was prepared as described for Example 2, except 27.0 g SEBS and unsubstituted PZT particles were used.

Example 3: Formation of a 40 vol. % PZT-Ph/SIS Composite. PZT-Ph was combined with SIS at 40 vol. %, based on total volume, and the resulting mixture was blended in a Haake compounder at 180° C. Blending was conducted by placing 27.6 g of SIS pellets in the Haake compounder and melting under mixing conditions. 153.4 g PZT-Ph particles were then combined with the molten SIS. After 10-15 minutes of blending, the mixture was discharged onto an aluminum pan and cooled to ambient temperature.

For filament fabrication, the resulting composite was first shredded to afford a coarse powder, and the powder was then extruded using a single-screw Filabot extruder.

Comparative Example 3: Formation of a 40 vol. % PZT/SIS Composite. This composite was prepared as described for Example 3, except unsubstituted PZT particles were used.

Example 4: Formation of a 40 vol. % PZT-NH$_2$/Polyamide Composite. Amine-functionalized PZT (PZT-NH$_2$) was combined with a polyamide (Nylon-6, Sigma-Aldrich) at 40 vol. %, based on total volume, and the resulting mixture was blended in a Haake compounder at 230° C. Blending was conducted by placing 32.5 g of polyamide pellets in the Haake compounder and melting under mixing conditions. After melting occurred, 1.5 g of N-(2-aminoethyl)-3-aminopropyltrimethoxysilane was combined with the molten polyamide, and 153.4 g PZT particles were then added. After 10-15 minutes of blending, the mixture was discharged onto an aluminum pan and cooled to ambient temperature.

Comparative Example 4: Formation of a 40 vol. % PZT/Polyamide Composite. This composite was prepared as described for Example 4, except the N-(2-aminoethyl)-3-aminopropyltrimethoxysilane was omitted, thereby leaving the PZT particles unfunctionalized.

Shore Hardness. Hardness is a measure of the resistance of a material to indentation. The samples produced above were characterized in terms of their Shore Hardness values. Table 1 summarizes the Shore Hardness values of selected samples produced above. Shore A and Shore D hardness values were determined by a Shore D Rex Model DD-4 instrument according to ASTM S-2240, using the instantaneous instrument readout value.

TABLE 1

| Sample | Shore A Hardness | Shore D Hardness |
|---|---|---|
| Example 2 | 87.2 ± 1.2 | 35.5 ± 2.6 |
| Comparative Example 2 | 79.0 ± 0.6 | 25.9 ± 1.0 |
| Example 3 | 97.0 ± 1.3 | 46.1 ± 1.5 |
| Comparative Example 3 | 96.4 ± 0.3 | 48.9 ± 0.2 |

All samples containing piezoelectric particles exhibited higher Shore Hardness values than did the parent polymers (polymer-only data not shown). In the case of SEBS, functionalization of the PZT particles afforded higher values for both Shore A and Shore D Hardness, which may be indicative of increased non-covalent interactions between the polymer and the functionalized PZT particles. SIS-containing samples (Example 3 and Comparative Example 3) did not exhibit significantly different Shore Hardness values, possibly due to the higher initial hardness of SIS alone.

Figure 4A:
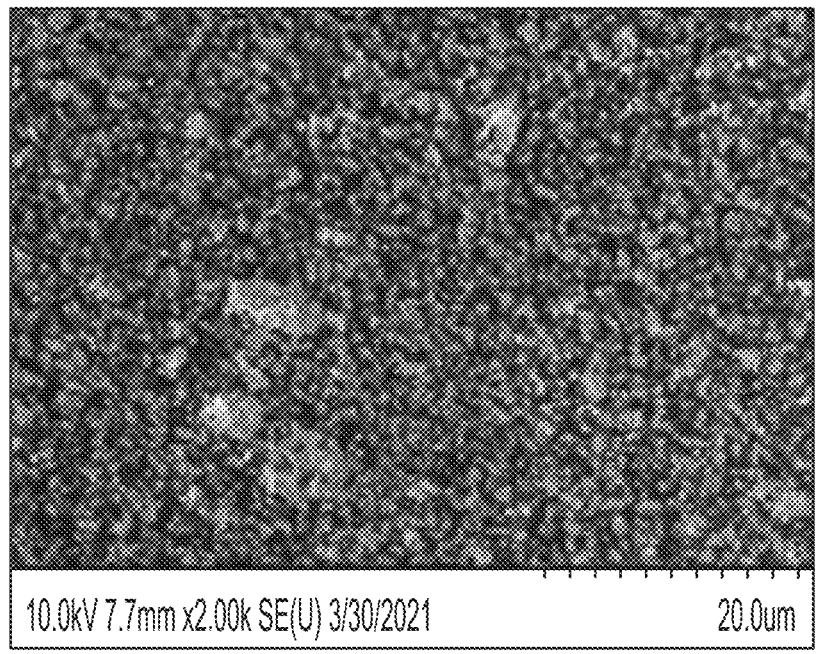
FIGS. 4A and 4B show illustrative SEM images for the samples of Example 2 and Comparative Example 2, respectively.
Figure 4B:
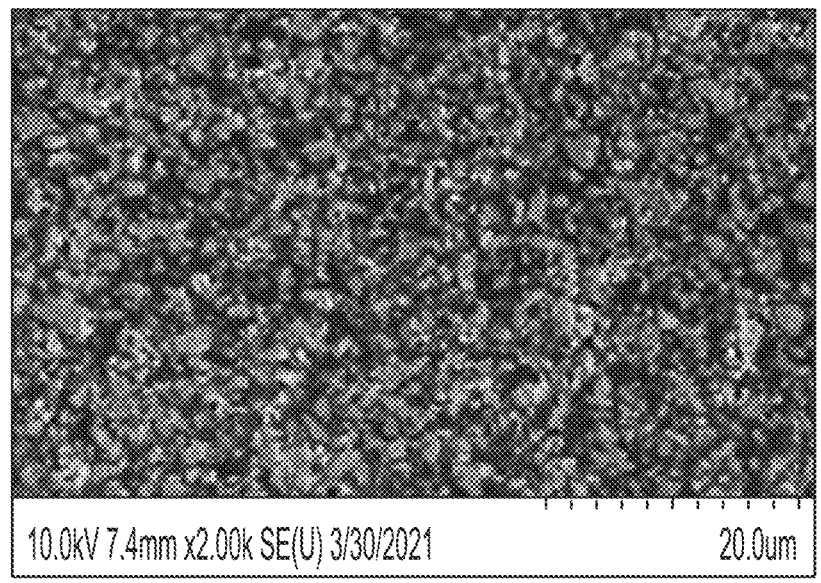
Figure 5A:
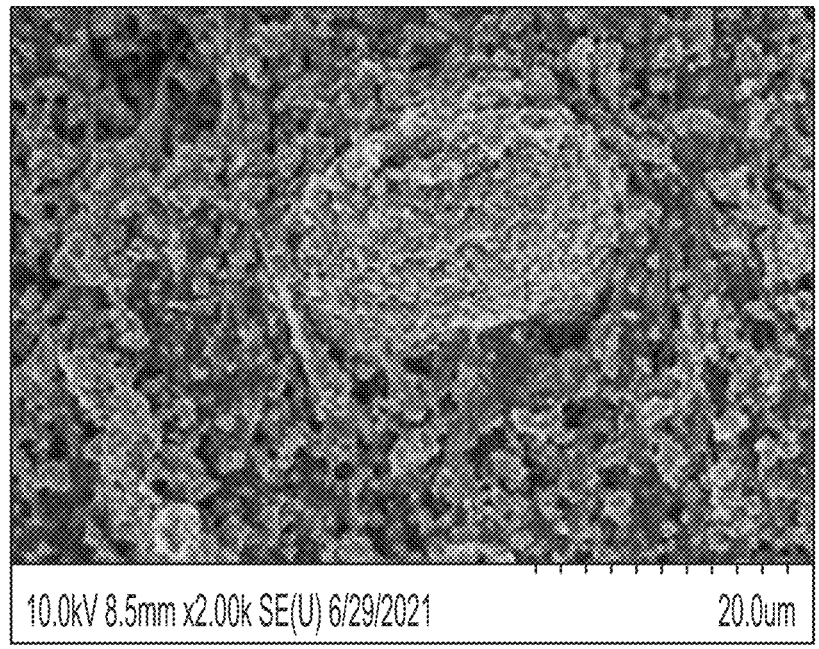
FIGS. 5A and 5B show illustrative SEM images for the samples of Example 3 and Comparative Example 3, respectively.
Figure 5B:
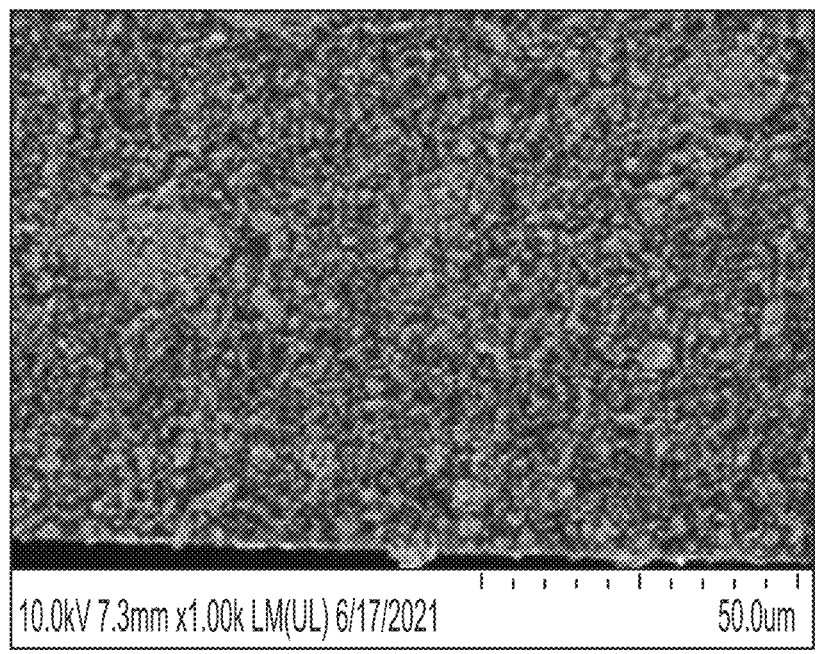

Imaging. The samples produced above were characterized by SEM imaging. FIGS. 4A and 4B show illustrative SEM images for the samples of Example 2 and Comparative Example 2. FIGS. 5A and 5B show illustrative SEM images for the samples of Example 3 and Comparative Example 3. In both cases, the samples containing PZT-Ph were more uniformly dispersed in the polymer (as evidenced by fewer dark spots in the SEM image).

Filament Extrusion. For filament extrusion, the samples were first shredded to afford a coarse powder, and the powder was then extruded using a single-screw Filabot FX6 extruder. The extruder was modified with a digital voltage readout to control the motor speed and extrusion rate. The Filabot EX6 filament extruder is capable of zonal temperature variation among the feed port nozzle, a back zone, a middle zone, and a front zone. The air path of the Filabot EX6 filament extruder may be further adjusted with respect to distance from the feed port nozzle or by raising the air path on a jack. The air path height was kept constant here, and 100% airflow was used during extrusion, except in one instance. Table 2 below summarizes the extrusion conditions and filament properties used when preparing composite filaments from the composites of Examples 2 and 3 and Comparative Examples 2 and 3. Measurement of the filament diameter was conducted using an inline thickness gauge.

TABLE 2

| Feed Material Source | Example 2 | Comparative Example 2 | Example 3 | Comparative Example 3 |
|---|---|---|---|---|
| Feed Temperature | 40° C. | 40° C. | 40° C. | 40° C. |
| Back Temperature | 190° C. | 190° C. | 180° C. | 180° C. |
| Middle Temperature | 200° C. | 200° C. | 180° C. | 180° C. |
| Front Temperature | 200° C. | 200° C. | 180° C. | 180° C. |
| Voltage | 4 V | 15 V | 10 V | 10 V |
| Nozzle size | 1.75 mm | 1.75 mm | 1.75 mm | 1.75 mm |
| Air flow | 100% | 80% | 100% | 100% |
| Average filament diameter | 1.6-1.8 mm | 1.6.1.8 mm | 1.6-2.0 mm | 1.6-1.7 mm |

Printed Samples. The filaments made from Example 3 and Comparative Example 3 were printed as 20 mm squares of varying thicknesses using a Hyrel Hydra 16 A printer under the printing conditions specified in Table 3 below.

TABLE 3

| Filament Material Source | Example 3 | Comparative Example 3 |
|---|---|---|
| Print Head Nozzle | 1.75 mm | 2.85 mm |
| Nozzle | 0.5 mm | 0.5 mm |
| Extruder Temperature | 230° C. | 230° C. |
| Bed | Glass plate + DIMAFIX adhesive | Glass plate |
| Bed Temperature | 70° C. | 70° C. |
| Print Speed | 10 mm/s | 10 mm/s |

Piezoelectric properties and additional characteristics of the printed samples are discussed further below.

Thermopressed Samples. The composites from Examples 2-4 and Comparative Examples 2-4 were also thermopressed into 20 mm squares of varying thicknesses using a Carver hydraulic press with the samples heated above their melting point or glass transition temperature in a mold. Piezoelectric properties and additional characteristics of the thermopressed samples are discussed further below.

Piezoelectric Properties. Piezoelectric properties of the printed and thermopressed samples were evaluated by measuring $d_{33}$ values using an APC International Wide-Range $d_{33}$ meter or a Piezotest PM300 Piezo meter. The $d_{33}$ meter is capable of measuring $d_{33}$ values between 1-2000 pC/N at an operating frequency of 110 Hz and an amplitude of 0.25 N. The $d_{33}$ value represents the quantity of charge generated when a piezoelectric material is subjected to a set applied force (amplitude). Description of the printed or thermopressed samples and their piezoelectric properties are provided in Table 4 below.

Prior to making the $d_{33}$ measurements, all samples were poled by a corona poling method in which the sample was exposed to a corona discharge for times ranging from 2 to 60 minutes, but more typically 30 minutes. In the corona poling method, the sample was first coated with a thin layer of sputtered metal (Au, Pt, or Al) on one side of the sample, which was then exposed to a wire-generated corona (6-8 kV) located at a distance of about 1 mm from the sample. Since a surface area of approximately 300 µm² is exposed to the corona at a given time, the sample was moved to pole the complete surface through exposure to the corona. The poling process was not optimized. Contact poling in a high dielectric medium may be used as an alternative poling procedure.

TABLE 4

| Entry | Composite | Sample Type | Sample Thickness (µm) | Avg. $d_{33}$ Value (pC/N) |
|---|---|---|---|---|
| 1 | Example 2 | Thermopressed | 200 | 11 |
| 2 | Comparative Example 2 | Thermopressed | 180 | 6 |
| 3 | Example 3 | Printed | 370 | 3.4 |
| 4 | Example 3 | Thermopressed | 385 | 5.8 |
| 5 | Comparative Example 3 | Printed | 320 | 0.3 |
| 6 | Comparative Example 3 | Thermopressed | 530 | 4.0 |
| 7 | Example 4 | Thermopressed | 600 | 12.5 |
| 8 | Comparative Example 4 | Thermopressed | 300 | 10.5 |

As shown, all samples containing PZT-Ph exhibited higher $d_{33}$ values than did the comparable comparative samples containing unfunctionalized PZT. This result implies that π-π interactions may increase $d_{33}$ values. Comparing Entries 7 and 8, it can be seen that when the piezoelectric particles are functionalized to include a group capable of donating or accepting hydrogen bonds and the polymer also contains a group capable of donating or accepting hydrogen bonds, increased $d_{33}$ values may be realized (Entry 7). The increased $d_{33}$ values of Entry 7 were observed despite this sample's larger thickness, which can decrease the poling efficiency.

All documents described herein are incorporated by reference herein for purposes of all jurisdictions where such practice is allowed, including any priority documents and/or testing procedures to the extent they are not inconsistent with this text. As is apparent from the foregoing general description and the specific embodiments, while forms of the disclosure have been illustrated and described, various modifications can be made without departing from the spirit and scope of the disclosure. Accordingly, it is not intended that the disclosure be limited thereby. For example, the compositions described herein may be free of any component, or composition not expressly recited or disclosed herein. Any method may lack any step not recited or disclosed herein. Likewise, the term "comprising" is considered synonymous with the term "including." Whenever a method, composition, element or group of elements is preceded with the transitional phrase "comprising," it is understood that we also contemplate the same composition or group of elements with transitional phrases "consisting essentially of," "consisting of," "selected from the group consisting of," or "is" preceding the recitation of the composition, element, or elements and vice versa.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

One or more illustrative embodiments are presented herein. Not all features of a physical implementation are described or shown in this application for the sake of clarity. It is understood that in the development of a physical embodiment of the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for one of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to one having ordinary skill in the art and having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present disclosure. The embodiments illustratively disclosed herein suitably may be practiced in the absence of any element that is not specifically disclosed herein and/or any optional element disclosed herein.

What is claimed is the following:

1. A composition comprising:
    a plurality of piezoelectric particles dispersed in at least a portion of a polymer material;
        wherein the piezoelectric particles interact non-covalently with the polymer material via π-π bonding, hydrogen bonding, electrostatic interactions stronger than van der Waals interactions, or any combination thereof; and
        wherein the piezoelectric particles are substantially non-agglomerated when combined with the polymer material.

2. The composition of claim 1, wherein the polymer material and the piezoelectric particles collectively define an extrudable material that is a composite having a form factor selected from the group consisting of a composite filament, a composite pellet, a composite powder, and a composite paste.

3. The composition of claim 2, wherein the piezoelectric particles are uniformly dispersed in at least a portion of the polymer material.

4. The composition of claim 1, wherein the polymer material and the piezoelectric particles collectively define an extrudable material that is a composite filament.

5. The composition of claim 1, wherein the piezoelectric particles have an average particle size of about 10 microns or less.

6. The composition of claim 1, wherein the polymer material comprises at least one thermoplastic polymer.

7. The composition of claim 6, wherein the at least one thermoplastic polymer comprises at least one monomer that undergoes π-π bonding, hydrogen bonding, electrostatic interactions, or any combination thereof with the piezoelectric particles.

8. The composition of claim 1, wherein the piezoelectric particles and the polymer material interact non-covalently at least by π-π bonding.

9. The composition of claim 1, wherein the piezoelectric particles and the polymer material interact non-covalently at least by a charge-charge interaction.

10. The composition of claim 1, wherein the piezoelectric particles are covalently functionalized with a moiety that undergoes π-π bonding, hydrogen bonding, electrostatic interactions, or any combination thereof with the polymer material.

11. The composition of claim 1, wherein the polymer material comprises a first polymer material and a second polymer material that are immiscible with each other.

12. An additive manufacturing process comprising:
    providing the composition of claim 1; and
    forming a printed part by depositing the composition layer-by-layer.

13. The additive manufacturing process of claim 12, wherein the polymer material comprises at least one thermoplastic polymer and the composition is heated at or above a melting point or softening temperature of the at least one thermoplastic polymer when forming the printed part.

14. The additive manufacturing process of claim 13, wherein the at least one thermoplastic polymer comprises at least one monomer that undergoes π-π bonding, hydrogen bonding, electrostatic interactions, or any combination thereof with the piezoelectric particles.

15. The additive manufacturing process of claim 12, wherein the piezoelectric particles have an average particle size of about 10 microns or less.

16. The additive manufacturing process of claim 12, wherein the polymer material and the piezoelectric particles collectively define an extrudable material that is a composite filament, and forming the printed part comprises a fused filament fabrication process.

17. The additive manufacturing process of claim 12, wherein the piezoelectric particles and the polymer material non-covalently interact at least by $\pi$-$\pi$ bonding.

18. The additive manufacturing process of claim 12, wherein the piezoelectric particles and the polymer material interact non-covalently at least by a charge-charge interaction.

* * * * *